US 7,439,122 B2

(12) United States Patent
Shimizu

(10) Patent No.: US 7,439,122 B2
(45) Date of Patent: Oct. 21, 2008

(54) METHOD OF MANUFACTURING SEMICONDUCTOR DEVICE HAVING IMPROVED RESURF TRENCH ISOLATION AND METHOD OF EVALUATING MANUFACTURING METHOD

(75) Inventor: Kazuhiro Shimizu, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/850,780

(22) Filed: Sep. 6, 2007

(65) Prior Publication Data

US 2008/0009113 A1    Jan. 10, 2008

Related U.S. Application Data

(62) Division of application No. 10/761,235, filed on Jan. 22, 2004, now Pat. No. 7,294,901.

(30) Foreign Application Priority Data

May 20, 2003    (JP)    ............................ 2003-141625

(51) Int. Cl.
  *H01L 21/76*    (2006.01)
(52) U.S. Cl. .............................. 438/218; 438/18; 257/48
(58) Field of Classification Search ................. 257/343, 257/409, 491, 492, 493, E27.011, E27.013, 257/E27.014, E27.016, E27.028, E27.029; 438/218, 219, 221, 404, 405
See application file for complete search history.

(56) References Cited

U.S. PATENT DOCUMENTS

| 4,292,642 A | 9/1981 | Appels et al. |
| 4,707,720 A | 11/1987 | Shirai et al. |
| 4,949,142 A | 8/1990 | Contiero et al. |
| 5,113,237 A | 5/1992 | Stengl |
| 5,455,439 A | 10/1995 | Terashima et al. |
| 5,801,418 A | 9/1998 | Ranjan |
| 5,883,413 A | 3/1999 | Ludikhuize |
| 5,894,156 A | 4/1999 | Terashima et al. |
| 5,907,182 A | 5/1999 | Terashima |
| 6,078,090 A | 6/2000 | Williams et al. |
| 6,274,919 B1 | 8/2001 | Wada |
| 6,376,891 B1 | 4/2002 | Nagatani et al. |
| 6,489,653 B2 | 12/2002 | Watanabe et al. |

(Continued)

FOREIGN PATENT DOCUMENTS

JP    5-190693    7/1993

(Continued)

*Primary Examiner*—Lynne A. Gurley
*Assistant Examiner*—Andrew O. Arena
(74) *Attorney, Agent, or Firm*—Oblon, Spivak, McClelland, Maier & Neustadt, P.C.

(57) ABSTRACT

A p impurity region (3) defines a RESURF isolation region in an n⁻ semiconductor layer (2). A trench isolation structure (8a) and the p impurity region (3) together define a trench isolation region in the n⁻ semiconductor layer (2) in the RESURF isolation region. An nMOS transistor (103) is provided in the trench isolation region. A control circuit is provided in the RESURF isolation region excluding the trench isolation region. An n⁺ buried impurity region (4) is provided at the interface between the n⁻ semiconductor layer (2) and a p⁻ semiconductor substrate (1), and under an n⁺ impurity region 7 connected to a drain electrode (14) of the nMOS transistor (103).

4 Claims, 27 Drawing Sheets

U.S. PATENT DOCUMENTS

| | | |
|---|---|---|
| 6,608,350 B2 | 8/2003 | Kinzer et al. |
| 6,798,037 B2 | 9/2004 | Leonardi |
| 2002/0008299 A1 | 1/2002 | Leonardi |
| 2002/0100935 A1 | 8/2002 | Inoue |
| 2002/0102808 A1 | 8/2002 | Pu et al. |
| 2002/0113286 A1 | 8/2002 | Shimizu |

FOREIGN PATENT DOCUMENTS

| | | |
|---|---|---|
| JP | 9-283716 | 10/1997 |
| JP | 10-12607 | 1/1998 |
| KR | 10-0327977 | 10/1998 |
| KR | 10-0210213 | 4/1999 |

F I G . 2 3
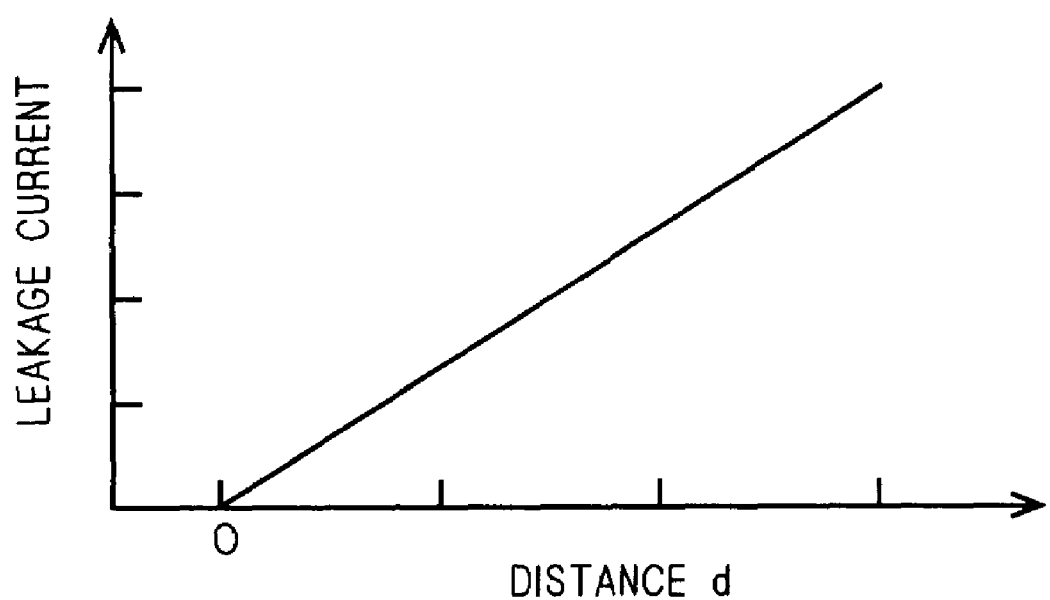

METHOD OF MANUFACTURING SEMICONDUCTOR DEVICE HAVING IMPROVED RESURF TRENCH ISOLATION AND METHOD OF EVALUATING MANUFACTURING METHOD

CROSS-REFERENCE TO RELATED APPLICATIONS

The present application is a divisional of U.S. application Ser. No. 10/761,235 filed on Jan. 22, 2004, now U.S. Pat. No. 7,294,901, and in turn claims priority to JP 2003-141625 filed on May 20, 2003, the entire contents of each of which are hereby incorporated herein by reference.

BACKGROUND OF THE INVENTION

1. Field of the Invention

The present invention relates to semiconductor technology using RESURF (reduced surface field) effect.

2. Description of the Background Art

As an example of technology for improving a breakdown voltage using RESURF effect is introduced in Japanese Patent Application Laid-Open No. 9-283716 (1997), which shows in FIG. 12 a semiconductor device comprising an n-channel RESURF MOSFET and a RESURF isolation island region. In this semiconductor device, an n⁻ epitaxial layer 2 and an n⁺ buried diffusion region 4 are surrounded by a p diffusion region 3, whereby a RESURF structure is defined.

In the semiconductor device of FIG. 12 in Japanese Patent Application Laid-Open No. 9-283716 (1997), an aluminum interconnect line which experiences application of a high potential passes over the p diffusion region 3 placed at the same potential as a substrate potential. Extension of a depletion layer is thus inhibited by the electric field applied from the aluminum interconnect line 8, causing drop in breakdown voltage.

In response, Japanese Patent Application Laid-Open No. 9-283716 (1997) suggests in FIGS. 1 and 2 a semiconductor device which includes no RESURF structure between the n-channel RESURF MOSFET and the RESURF isolation island region. Instead, a narrow portion 1a as a part of a p⁻ substrate 1 is formed therebetween which has an upper surface exposed from the p⁻ substrate 1. When n diffusion regions 12a and 12b are subjected to application of a high potential, the portion 1a held between the n diffusion regions 12a and 12b are depleted, thereby causing no significant potential difference between the portion 1a and the n diffusion regions 12a, 12b. As a result, the potential difference is controlled to be small between the aluminum interconnect line 8 and the surface of the p⁻ substrate 1 thereunder, whereby the foregoing problem is avoided.

Semiconductor technology using RESURF effect is also introduced in U.S. Pat. Nos. 4,292,642 and 5,801,418, and in "THIN LAYER HIGH-VOLTAGE DEVICES (RESURF DEVICES)", pp. 1-13, J. A. Appels et al., Philips Journal of Research, vol. 35. No. 1, 1980, for example. Japanese Patent Application Laid-Open No. 5-190693 (1993) introduces a technique for stabilizing an electric field of a surface of a semiconductor substrate by means of capacitive coupling between field plates in a multilayered structure which are insulated from their surroundings. Japanese Patent Application Laid-Open No. 10-12607 (1998) introduces a technique for preventing generation of a leakage current by means of polarization of a molding resin.

In the semiconductor device of FIGS. 1 and 2 in Japanese Patent Application Laid-Open No. 9-283716 (1997), formation of the n diffusion regions 12a and 12b requires diffusion process for providing the portion 1a between the n diffusion regions 12a and 12b. That is, such a semiconductor device inherently experiences drop in surge breakdown voltage.

SUMMARY OF THE INVENTION

It is therefore an object of the present invention to provide semiconductor technology allowing improvement in surge breakdown voltage.

A semiconductor device according to the present invention includes a semiconductor substrate of a first conductivity type, a semiconductor layer of a second conductivity type, a first impurity region of the first conductivity type, a trench isolation structure, a semiconductor element, and a MOS transistor. The semiconductor layer is provided on the semiconductor substrate. The first impurity region is provided in the semiconductor layer, extending from an upper surface of the semiconductor layer to reach an interface with the semiconductor substrate, to define a RESURF isolation region. The trench isolation structure is provided in the semiconductor layer defined in the RESURF isolation region to be connected to the first impurity region, extending from the upper surface of the semiconductor layer to reach at least the vicinity of the interface with the semiconductor substrate. The trench isolation structure and the first impurity region together define a trench isolation region in the RESURF isolation region. The semiconductor element is provided in the semiconductor layer defined in the RESURF isolation region excluding the trench isolation region. The MOS transistor includes a second impurity region of the second conductivity type which is connected to a drain electrode of the MOS transistor, a third impurity region of the first conductivity type, and a source region of the second conductivity type. The second impurity region is provided in the upper surface of the semiconductor layer defined in the trench isolation region. The third impurity region is provided in the upper surface of the semiconductor layer defined between the first and second impurity regions. The source region is provided in an upper surface of the third impurity region. The semiconductor device further includes a buried impurity region of the second conductivity type higher in impurity concentration than the semiconductor layer. The buried impurity region is provided under the second impurity region and at the interface between the semiconductor layer and the semiconductor substrate.

The MOS transistor is arranged in the trench isolation region defined by the first impurity region and the trench isolation structure. Leakage of a source-drain current of the MOS transistor into the semiconductor layer is thereby suppressed in which the semiconductor element is provided.

Further, the buried impurity region higher in impurity concentration than the semiconductor layer is provided under the second impurity region for making connection with the drain electrode. A surge breakdown voltage is improved accordingly when the drain electrode is subjected to application of a high potential.

These and other objects, features, aspects and advantages of the present invention will become more apparent from the following detailed description of the present invention when taken in conjunction with the accompanying drawings.

BRIEF DESCRIPTION OF THE DRAWINGS

FIG. 23 is a graph showing the relation of a distance between insulating films and a leakage current in a trench isolation structure;

DESCRIPTION OF THE PREFERRED EMBODIMENTS

First Preferred Embodiment

Figure 1:
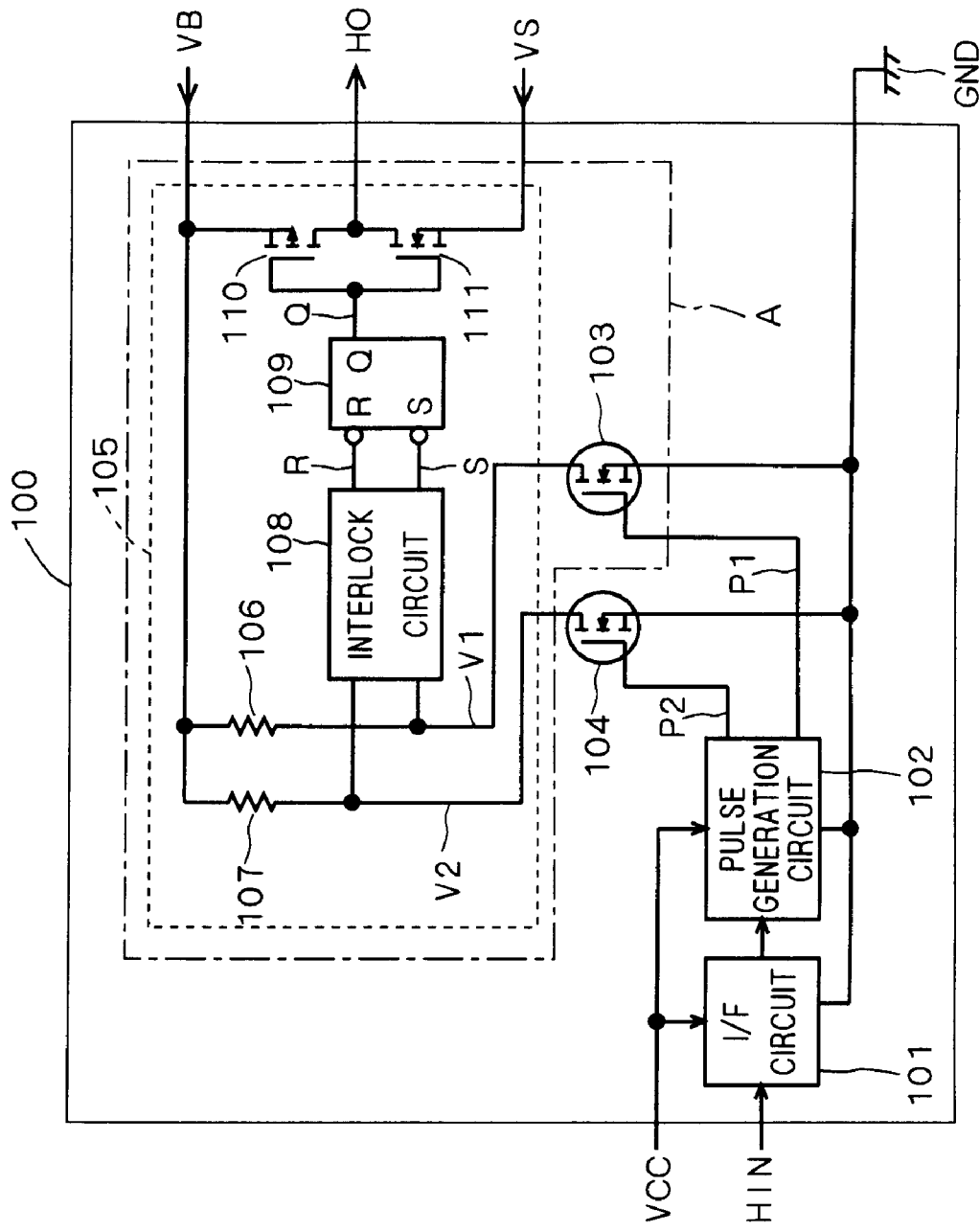
FIG. 1 is a block diagram of the configuration of a semiconductor device according to a first preferred embodiment of the present invention.

FIG. 1 is a block diagram of the configuration of a semiconductor device 100 according to a first preferred embodiment of the present invention. The semiconductor device 100 is a high voltage IC (HVIC) which realizes improvement in breakdown voltage using RESURF effect. As an example, the semiconductor device 100 is operative to drive an IGBT (insulated gate bipolar transistor) of higher potential which is connected to another IGBT in a totem-pole configuration.

With reference to FIG. 1, the semiconductor device 100 of the first preferred embodiment comprises an interface circuit 101 (hereinafter referred to as "I/F circuit 101"), a pulse generation circuit 102, high voltage nMOS transistors 103 and 104, and a control circuit 105.

The IF circuit 101 performs waveform shaping on a signal HIN inputted to the semiconductor device 100 from outside, and outputs the resultant signal to the pulse generation circuit 102. On the basis of high-to-low and low-to-high transitions of the signal HIN after being subjected to waveform shaping, the pulse generation circuit 102 generates pulse signals P1 and P2, respectively. The pulse signal P1 is given to the gate of the nMOS transistor 103, and the pulse signal P2 is given to the gate of the nMOS transistor 104. Triggered by the pulse signals P1 and P2, respectively, the nMOS transistors 103 and 104 are turned on and off. In order to minimize power consumption (heat generation) of the nMOS transistors 103 and 104, the pulse signals P1 and P2 are such that they each have a pulse duration as short as some several hundreds of nanoseconds.

A power source potential VCC and a ground potential GND are both applied to the I/F circuit 101 and the pulse generation circuit 102, by means of which I/F circuit 101 and the pulse generation circuit 102 are brought to an operating state. The ground potential GND is also applied to each source of the nMOS transistors 103 and 104. As an example, the power source potential VCC is set to be $^{+}15$ V.

The control circuit 105 comprises resistors 106 and 107, an interlock circuit 108, an RS flip-flop circuit 109, a pMOS transistor 110, and an nMOS transistor 111.

A high potential VB is applied from the outside of the semiconductor device 100 to the source of the pMOS transistor 110. The potential VB is also applied to the drains of the nMOS transistors 103 and 104 through the resistors 106 and 107, respectively.

A drain potential V1 of the nMOS transistor 103 and a drain potential V2 of the nMOS transistor 104 are inputted to the interlock circuit 108. On the basis of the drain potentials V1 and V2, respectively, the interlock circuit 108 generates signals S and R. The signals S and R are then inputted to the SET input and RESET input of the flip-flop circuit 109, respectively.

When the SET input and RESET input of the RS flip-flop circuit 109 both receive a high level signal, the output of the RS flip-flop circuit 109 is generally made unstable. The interlock circuit 108 is operative to prevent such instability.

The output of the RS flip-flop circuit 109 is inputted as a signal Q to the respective gates of the pMOS transistor 110 and the nMOS transistor 111. The pMOS transistor 110 and the nMOS transistor 111 are turned on and off in response to the signal Q1.

The respective drains of the pMOS transistor 110 and the nMOS transistor 111 are connected to each other. The connection point thereof bears a potential which is outputted as a signal HO to the outside of the semiconductor device 100. The source of the nMOS transistor 111 is subjected to application of a potential VS from the outside of the semiconductor device 100.

By way of example, the potentials VB and VS are several hundreds of volts, and the potential VB is set to be +15V relative to the potential VS. The potentials VB and VS are respectively applied to the interlock circuit 108 and the RS flip-flop circuit 109, by means of which the interlock circuit 108 and the RS flip-flop circuit 109 are brought to an operating state.

The signal HO from the semiconductor device 100 is inputted to the gate of an IGBT (not shown) of higher potential which is connected to another IGBT (not shown) in a totem-pole configuration. These two IGBTs are interposed between a high potential of some hundreds of volts and a ground potential. The IGBT of higher potential is turned on and off in response to the signal HO. The potential VS is also applied to the emitter of the IGBT of higher potential.

Next, the operation of the semiconductor device 100 of the first preferred embodiment will be discussed. When the signal HIN makes a low-to-high transition, the pulse generation circuit 102 outputs the pulse signal P2. The nMOS transistor 104 is triggered into on state by the pulse signal P2 given to the gate of the nMOS transistor 104, causing a current to flow through the resistor 107 which thereby experiences voltage drop. The drain potential V2 is changed accordingly to generate potential difference between the potential VB and the drain potential V2. As a result, the pulse signal P2 is shifted to a higher potential level.

When the change of the drain potential V2 is detected, the interlock circuit 108 outputs the signal R at a low level and the signal S at a high level to the RESET input and the SET input of the RS flip-clop circuit 109, respectively. The signal Q as the output of the RS flip-flop circuit 109 thereby goes low, causing the pMOS transistor 110 and the nMOS transistor 111 to be turned on and off, respectively. As a result, the signal HO at a high level is outputted to the outside of the semiconductor device 100, to thereby turn on the IGBT of higher potential.

When the signal HIN makes a high-to-low transition, the pulse generation circuit 102 outputs the pulse signal P1. The nMOS transistor 103 is triggered into on state by the pulse signal P1 given to the gate of the nMOS transistor 103, causing a current to flow through the resistor 106 which thereby experiences voltage drop. The drain potential V1 is changed accordingly to generate potential difference between the potential VB and the drain potential V1. As a result, the pulse signal P1 is shifted to a higher potential level.

When the change of the drain potential V1 is detected, the interlock circuit 108 outputs the signal S at a low level and the signal R at a high level to the SET input and the RESET input of the RS flip-flop circuit 109, respectively. The signal Q as the output of the RS flip-flop 109 thereby goes high, causing the pMOS transistor 110 and the nMOS transistor 111 to be turned off and on, respectively. As a result, the signal HO at a low level is outputted to the outside of the semiconductor device 100, to thereby turn off the IGBT of higher potential.

As discussed, the semiconductor device 100 of the first preferred embodiment is operative to control switching of the IGBT of higher potential.

Figure 2:
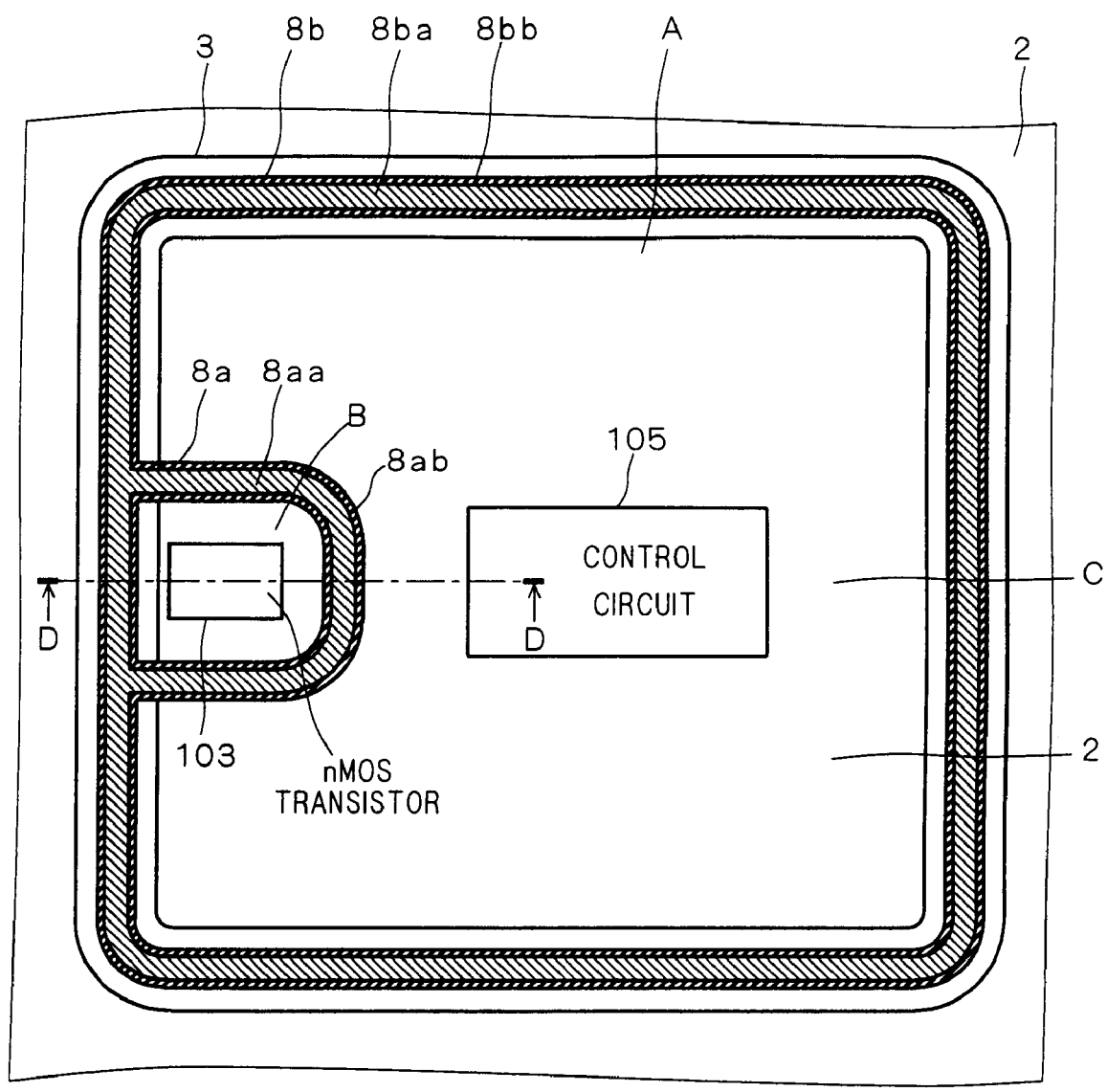
FIG. 2 is a plan view of the structure of the semiconductor device according to the first preferred embodiment.
Figure 3:
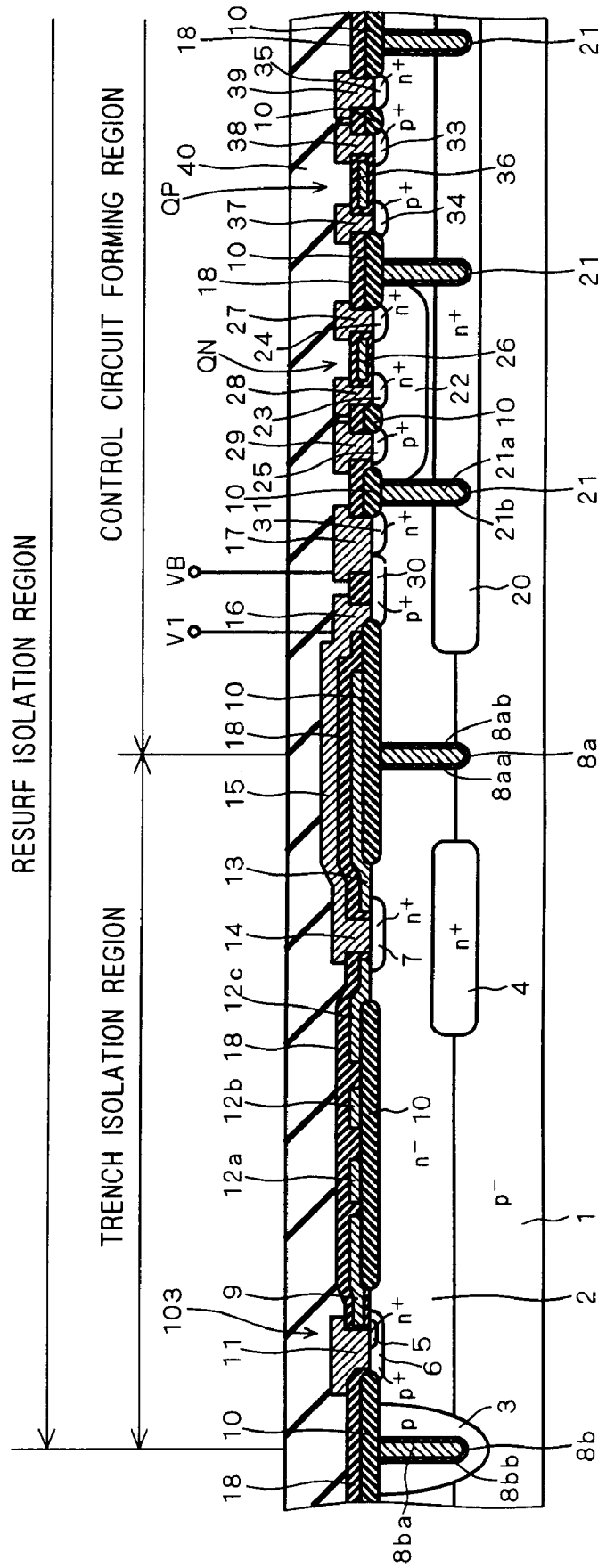
FIG. 3 is a sectional view of the structure of the semiconductor device according to the first preferred embodiment.

The structure of the semiconductor device 100 will be discussed next. FIG. 2 is a plan view of the structure of the semiconductor device 100 according to the first preferred embodiment. FIG. 3 is a sectional view taken along an arrowed line D-D of FIG. 2. For the convenience of description, the structure over an $n^-$ semiconductor layer 2 of FIG. 3 (including an isolation insulating film 10) is omitted from FIG. 2.

As shown in FIGS. 2 and 3, the $n^-$ semiconductor layer 2 is provided over a $p^-$ semiconductor substrate 1. As an example, the $n^-$ semiconductor layer 2 is an epitaxial layer including silicon. The isolation insulating film 10, which may be a silicon oxide film, for example, is provided in the upper surface of the $n^-$ semiconductor layer 2. A p impurity region 3 is provided in the $n^-$ semiconductor layer 2, extending from the upper surface of the $n^-$ semiconductor layer 2 to reach the interface with the $p^-$ semiconductor substrate 1. The p impurity region 3 surrounds a part of the $n^-$ semiconductor layer 2, whereby a RESURF isolation region A which includes the foregoing nMOS transistor 103 and the control circuit 105 therein is defined in the $n^-$ semiconductor layer 2.

A trench isolation structure 8a is provided in the $n^-$ semiconductor layer 2 defined in the RESURF isolation region A, extending from the upper surface of the $n^-$ semiconductor layer 2 to reach the interface with the $p^-$ semiconductor substrate 1. The trench isolation structure 8a is connected to the p impurity region 3, which together surround a part of the $n^-$ semiconductor layer 2 in the RESURF isolation region A. That is, the p impurity region 3 and the trench isolation structure 8a together define a trench isolation region B which includes the nMOS transistor 103 therein in the RESURF isolation region A. The control circuit 105 is arranged in a region in the RESURF isolation region A excluding the trench isolation region B, which region is referred to as a "control circuit forming region C".

A trench isolation structure 8b is provided in the $n^-$ semiconductor layer 2 defined in the RESURF isolation region A, extending from the upper surface of the $n^-$ semiconductor layer 2 to reach the interface with the $p^-$ semiconductor substrate 1. The trench isolation structure 8b extends along the periphery of the RESURF isolation region A. The trench isolation region 8b is surrounded by the p impurity region, at the surface except that exposed from the upper surface of the $n^-$ semiconductor layer 2. The trench isolation structures 8b and 8a are coupled to each other.

The trench isolation structure 8a includes a conductive film 8aa and an insulating film 8ab. The trench isolation structure 8b includes a conductive film 8ba and an insulating film 8bb. The conductive films 8aa and 8ba, which may be polysilicon films, for example, are coupled to each other. The conductive films 8aa and 8ba are provided in the $n^-$ semiconductor layer 2, extending from the upper surface of the $n^-$ semiconductor layer 2 to reach the interface with the $p^-$ semiconductor substrate 1.

The conductive film 8aa is covered with the insulating film 8ab, at the surface buried in the $n^-$ semiconductor layer 2 and the $p^-$ semiconductor substrate 1 except that exposed from the upper surface of the $n^-$ semiconductor layer 2. The conductive film 8ba is covered with the insulating film 8bb, at the surface except that exposed from the upper surface of the $n^-$ semiconductor layer 2. The insulating films 8ab and 8bb, which may be silicon oxide films, for example, are coupled to each other.

In the control circuit forming region C, an $n^+$ buried impurity region 20 is selectively provided at the interface between the $n^-$ semiconductor layer 2 and the $p^-$ semiconductor substrate 1. In the upper surface of the $n^-$ semiconductor layer 2 defined over the n$^+$ buried impurity region 20, a p$^+$ impurity region 30 operative to function as the resistor 106 of the control circuit 105 and an n$^+$ impurity region 31 are provided, to be adjacent to each other. In FIG. 3, an nMOS transistor QN and a pMOS transistor QP are shown which constitute a CMOS transistor of the interlock circuit 108 in the control circuit 105.

In the control circuit forming region C, trench isolation structures 21 are provided in the n$^-$ semiconductor layer 2, extending from the upper surface of the n$^-$ semiconductor layer 2 to reach the n$^+$ buried impurity region 20. The trench isolation structures 21 separate the p$^+$ and n$^+$ impurity regions 30 and 31, the nMOS transistor QN, and the pMOS transistor QP from each other.

The trench isolation structures 21 each include a conductive film 21a and an insulating film 21b. The conductive film 21a is provided in the n– semiconductor layer 2, extending from the upper surface of the n$^-$ semiconductor layer 2 to reach the n$^+$ buried impurity region 20. The conductive film 21a is surrounded by the insulating film 21b, at the surface except that exposed from the upper surface of the n$^-$ semiconductor layer 2.

The n$^-$ semiconductor layer 2 includes in its upper surface a p well region 22 over the n$^+$ buried impurity region 20. The nMOS transistor QN is formed in the p well region 22. The p well region 22 includes in its upper surface n$^+$ impurity regions 23 and 24 which respectively serve as source and drain regions of the nMOS transistor QN. A gate electrode 26 is provided above the p well region 22, to be held between the n$^+$ impurity regions 23 and 24. The p well region 22 includes in its upper surface a p$^+$ impurity region 25 to be adjacent to the n+ impurity region 23. The p$^+$ impurity region 25 and the n$^+$ impurity region 23 hold the isolation insulating film 10 therebetween.

The pMOS transistor QP and the nMOS transistor QN are adjacent to each other, while holding the trench isolation structure 21 therebetween. The n$^-$ semiconductor layer 2 over the n$^+$ buried impurity region 20 includes in its upper surface p$^+$ impurity regions 33 and 34 which respectively serve as source and drain regions of the pMOS transistor QP. A gate electrode 36 is provided above the n$^-$ semiconductor layer 2, to be held between the p$^+$ impurity regions 33 and 34. The n$^-$ semiconductor layer 2 includes in its upper surface an n$^+$ impurity region 35 to be adjacent to the p$^+$ impurity region 33. The n$^+$ impurity region 35 and the p$^+$ impurity region 33 hold the isolation insulating film 10 therebetween. The upper surface of each trench isolation structure 21 is covered with the isolation insulating film 10.

In the trench isolation region B, an n$^+$ impurity region 7 is provided in the upper surface of the n$^-$ semiconductor layer 2. A p$^+$ impurity region 6 is provided in the upper surface of the n– semiconductor layer 2, to be held between the n$^+$ impurity region 7 and the p impurity region 3. The p$^+$ impurity region 6 includes in its upper surface an n$^+$ impurity region as a source region 5 of the nMOS transistor 103. The n$^-$ semiconductor layer 2 defined between the p$^+$ impurity region 6 and the n$^+$ impurity region 7, and the n$^+$ impurity region 7 are together operative to function as a drain region of the nMOS transistor 103. An n$^+$ buried impurity region 4 is selectively provided under the n$^+$ impurity region 7, and at the interface between the n$^-$ semiconductor layer 2 and the p$^-$ semiconductor substrate 1. The n$^+$ buried impurity region 4 is higher in impurity concentration than the n$^-$ semiconductor layer 2.

A gate electrode 9 and field plates 12a, 12b and 12c are provided over the n$^-$ semiconductor layer 2 defined between the p$^+$ impurity region 6 and the n$^+$ impurity region 7, while holding the isolation insulating film 10 with the n$^-$ semiconductor layer 2. The gate electrode 9 and the field plates 12a, 12b and 12c are arranged in this order in a direction from the p$^+$ impurity region 6 towards the n$^+$ impurity region 7. The field plates 12a and 12b extend along the perimeter of the RESURF isolation region A.

The gate electrode 9 covers an end portion of the p$^+$ impurity region 6 with no contact therebetween, and is subjected to application of a gate potential. The field plate 12c contacts an end portion of the n$^+$ impurity region 7. The field plates 12a and 12b are floating electrodes insulated from their surroundings. The field plates 12a and 12b are interposed between the gate electrode 9 and the field plate 12c to respectively form capacitive coupling with the gate electrode 9 and the field plate 12c, whereby an electric field generated by the potential difference between the source and the drain of the nMOS transistor 103 is relaxed at the upper surface of the n$^-$ semiconductor layer 2.

Figure 4:
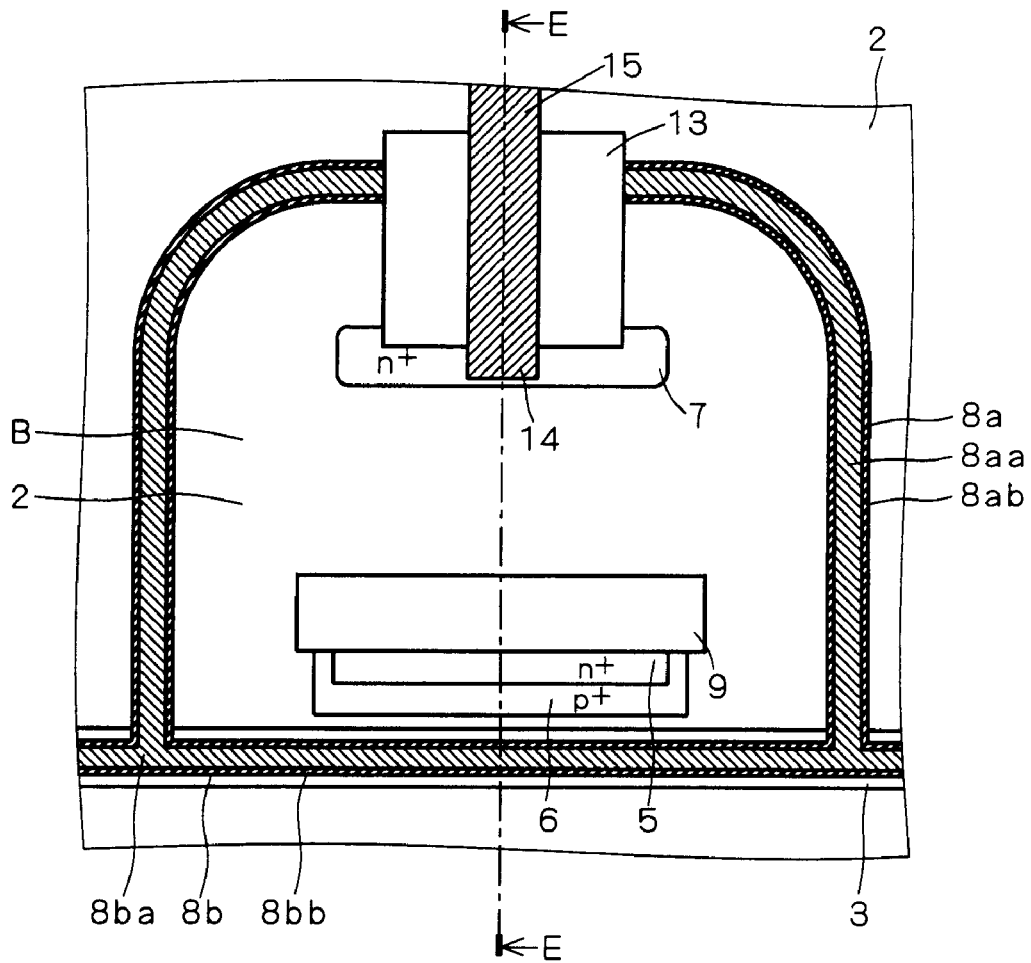
FIG. 4 is a plan view of the structure of the semiconductor device according to the first preferred embodiment.

A field plate 13 is provided over the n$^-$ semiconductor layer 2 defined between the p$^+$ impurity region 30 and the n$^+$ impurity region 7, while holding the isolation insulating film 10 with the n$^-$ semiconductor layer 2. FIG. 4 is an enlarged plan view of the trench isolation region B and its periphery shown in FIG. 2. FIG. 4 shows the structure over the n$^-$ semiconductor layer 2 including the field plate 13, an interconnect line 15 over the field plate 13, the gate electrode 9, and a drain electrode 14. The left half of the sectional view of FIG. 3 is taken along an arrowed line E-E of FIG. 4.

With references to FIGS. 3 and 4, the field plate 13 is arranged over the trench isolation structure 8a located between the p$^+$ impurity region 30 and the n$^+$ impurity region 7, and contacts an end portion of the n$^+$ impurity region 7. The field plate 13 is thereby electrically connected to the n$^-$ semiconductor layer 2 in the trench isolation region B.

The gate electrode 9, the field plates 12a to 12c, and the field plate 13 include polysilicon, for example. The trench isolation structures 8a and 8b and the p impurity region 3 have upper surfaces covered with the isolation insulating film 10.

An insulating film 18 is provided to cover the n$^-$ semiconductor layer 2, the isolation insulating film 10, the gate electrodes 9, 26 and 36, and the field plates 12a to 12c and 13. A source electrode 11 of the nMOS transistor 103 which contacts the p$^+$ impurity region 6 and the source region 5, and the drain electrode 14 of the nMOS transistor 103 which contacts the n$^+$ impurity region 7, both penetrate the insulating film 18.

An electrode 16 contacting one end portion of the p$^+$ impurity region 30 penetrates the insulating film 18, and is connected to the drain electrode 14 through the interconnect line 15. The interconnect line 15, which may be an aluminum line, for example, is arranged over the field plate 13.

An electrode 17 contacting another end of the p$^+$ impurity region 30 and the n$^+$ impurity region 31 penetrate the insulating film 18. Electrodes 29, 28 and 27 penetrate the insulating film 18 that respectively contact the p$^+$ impurity region 25 and the n$^+$ impurity regions 23 and 24. Electrodes 39, 38 and 37 also penetrate the insulating film 18 that respectively contact the n$^+$ impurity region 35 and the p$^+$ impurity regions 33 and 34.

As an example, aluminum is used to form the source and the drain electrodes 11 and 14, the electrodes 16, 17, 27 through 29, and the electrodes 37 through 39. For simplification of FIG. 3, a gate insulating film of the nMOS transistor 103, and respective gate insulating films of the nMOS transistor QN and the pMOS transistor QP of the control circuit 105, are shown as part of the insulating film 18.

An insulating film 40 is provided to cover the source and the drain electrodes 11 and 14, the electrodes 16, 17, 27 through 29, 37 through 39, and the insulating film 18.

Although not shown, the constituent elements of the semiconductor device 100 according to the first preferred embodiment other than the nMOS transistor 103 and the control circuit 105, namely, the I/F circuit 101, the pulse generation circuit 102 and the nMOS transistor 104, are arranged in the n⁻ semiconductor layer 2 excluding the RESURF isolation region A.

The potential VB is applied to the electrode 17. When a positive potential is applied to the gate electrode 9, the nMOS transistor 103 is turned on to cause a current to flow through the p⁺ impurity region 30, whereby potential difference is generated between the electrode 17 and the interconnect line 15. By detecting such potential difference, the logic signal applied to the gate electrode 9, that is, the pulse signal P1, is shifted to a higher potential level.

In the semiconductor device 100 of the first preferred embodiment, application of the potential VB and the ground potential GND to the electrode 17 and the p⁻ semiconductor substrate 1, respectively, cause a depletion layer to extend by means of RESURF effect in a direction from the p impurity region 3 towards the control circuit 105. This depletion layer thereafter extends along the perimeter of the RESURF isolation region A, to surround the control circuit 105. As a result, the control circuit 105 is allowed to have an improved breakdown voltage.

In the trench isolation region B, a depletion layer extends almost entirely in the n⁻ semiconductor layer 2 defined between the p impurity region 3 and the n⁺ buried impurity region 4. The nMOS transistor 103 is thereby allowed to have an improved breakdown voltage.

Figure 5:
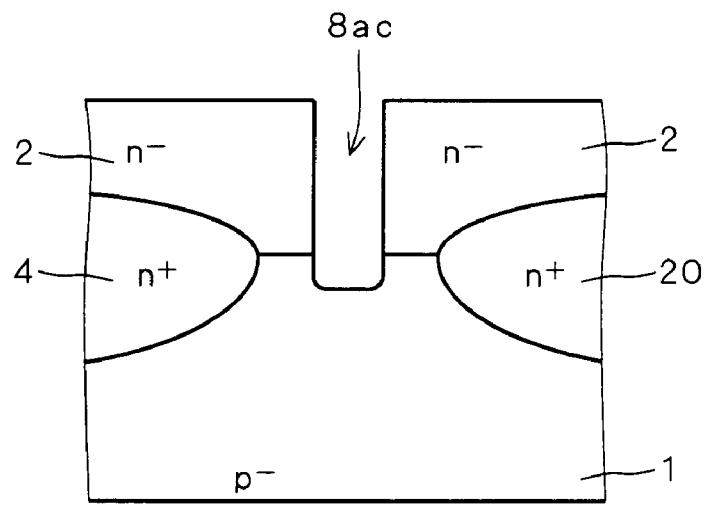
FIGS. 5 through 11 are sectional views showing a method of forming a trench isolation structure according to the first preferred embodiment.
Figure 6:
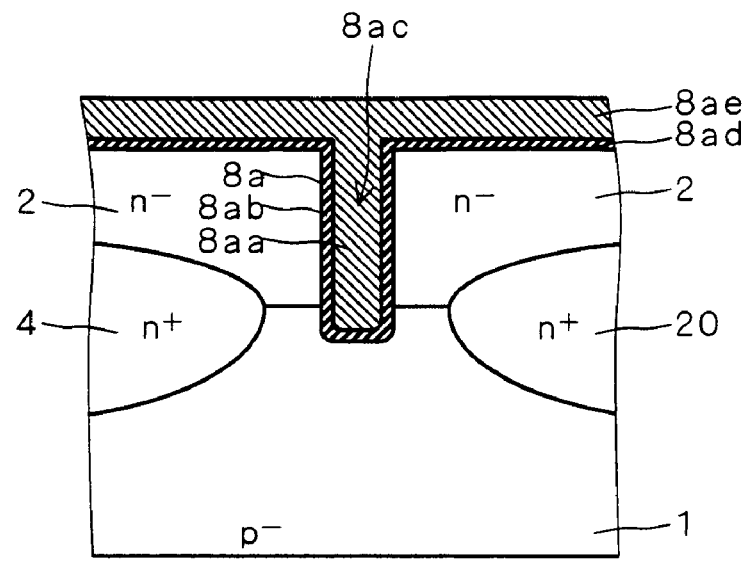
Figure 7:
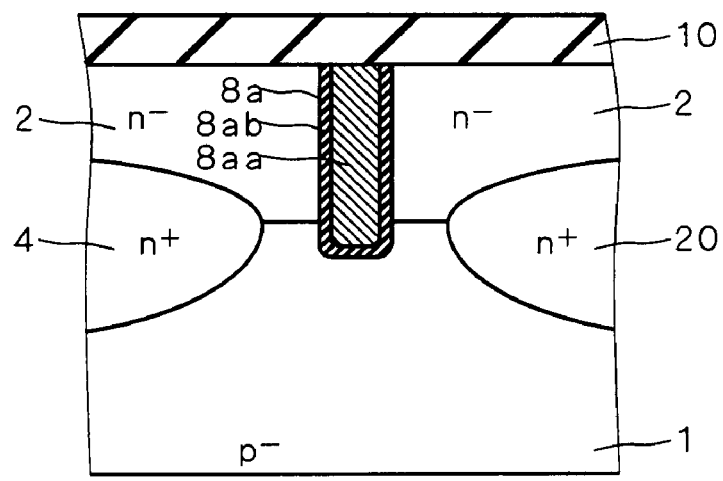
Figure 8:
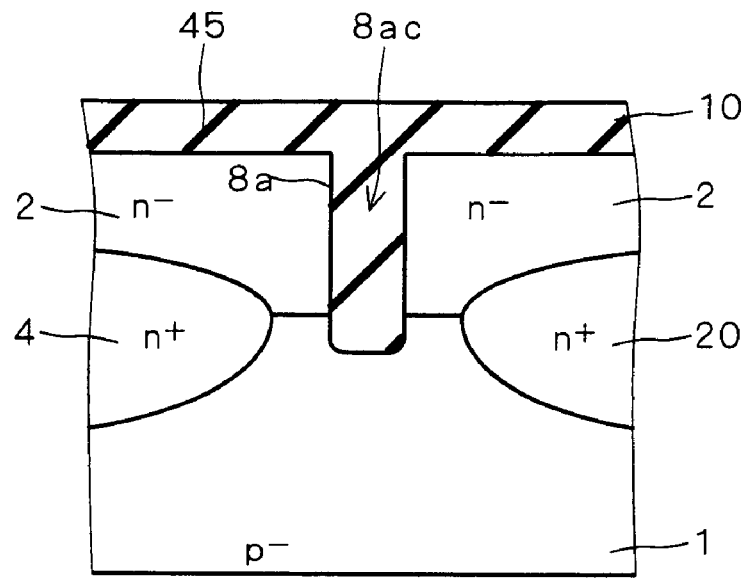

Next, a method of forming the trench isolation structures 8a, 8b and 21 will be discussed. The trench isolation structures 8a, 8b and 21 are formed in the same way, and hence it will be discussed with reference to FIGS. 5 through 7 how the trench isolation structure 8a as a representative is formed. FIGS. 5 through 7 are enlarged plan views of the portion defined between the n⁺ buried impurity regions 4 and 20 shown in FIG. 3.

With reference to FIG. 5, anisotropic etching is performed first to etch the upper surface of the n⁻ semiconductor layer 2, to thereby form a trench 8ac to reach the interface between the n⁻ semiconductor layer 2 and the p⁻ semiconductor substrate 1. With reference to FIG. 6, the inner wall of the trench 8ac and the upper surface of the n⁻ semiconductor layer 2 are thereafter oxidized to deposit an insulating film material 8ad on the inner surface of the trench 8ac and the upper surface of the n⁻ semiconductor layer 2. Subsequently, a conductive material 8ae, which may be polysilicon, for example, is deposited on the insulating film material 8ad to fill the trench 8ac.

Next, the insulating film material 8ad and the conductive material 8ae existing above the trench 8ac are removed. The resultant trench isolation structure 8a is shown in FIG. 7 which includes the polysilicon conductive film 8aa and the insulating film 8ab as a silicon oxide film. The isolation insulating film 10 is thereafter provided on the upper surfaces of the trench isolation structure 8a and the n⁻ semiconductor layer 2.

As discussed, in the semiconductor device 100 of the first preferred embodiment, the nMOS transistor 103 and the control circuit 105 are formed in the RESURF isolation region A which is defined by the p impurity region 3. This prevents the interconnect line 15 bearing a high potential from passing over the p impurity region 3 when the nMOS transistor 103 and the resistor 106 of the control circuit 105 are connected. As a result, a depletion layer is allowed to extend by means of RESURF effect in the n⁻ semiconductor layer 2 without inhibition, whereby the initial level of a breakdown voltage in a design stage can be maintained.

The nMOS transistor 103 is formed in the trench isolation region B which is surrounded by the p impurity region 3 and the trench isolation structure 8a. That is, insulation is established in the n⁻ semiconductor layer 2 between the region including the nMOS transistor 103 and the region including the control circuit 105. Leakage of the source-drain current of the nMOS transistor 103 into the n⁻ semiconductor layer 2 in the control circuit forming region C is suppressed accordingly, to thereby prevent a short circuit between the electrode 17 subjected to application of the potential VB and the drain electrode 14 of the nMOS transistor 103. As a result, the pulse signal P1 given to the gate electrode 9 of the nMOS transistor 103 can be shifted with reliability to a higher potential level.

The n⁺ buried impurity region 4 higher in impurity concentration than the n⁻ semiconductor layer 2 is provided under the n⁺ impurity region 7 that is connected to the drain electrode 14. Accordingly, a surge breakdown voltage is improved in the case of application of a high potential to the drain electrode 14.

The first preferred embodiment requires the field plate 13 between the trench isolation structure 8a and the interconnect line 15, which is operative to shield the trench isolation structure 8a from the electric field of the interconnect line 15. Drop in breakdown voltage as a result of the electric field from the interconnect line 15 is suppressed accordingly.

In the first preferred embodiment, a conductive film and an insulating film constitute the trench isolation structures 8a, 8b and 21, which constitution is not limited to this. An alternative and exemplary method of forming the trench isolation structure 8a will be discussed, in which an insulating film is the sole constituent. Like FIGS. 5 through 7, FIG. 8 is an enlarged plan view of the portion defined between the n⁺ buried impurity regions 4 and 20 shown in FIG. 3.

As described with reference to FIG. 5, the trench 8ac is formed first. Thereafter an insulating film 45, which may be a silicon oxide film, for example, is provided over the n⁻ semiconductor layer 2 to fill the trench 8ac. The trench isolation structure 8a and the isolation insulating film 10 both comprising the insulating film 45 are concurrently provided.

In the first preferred embodiment, the trench isolation structure 8a is shown to extend from the upper surface of the n⁻ semiconductor layer 2, reaching as far as the interface between the n⁻ semiconductor layer 2 and the p⁻ semiconductor substrate 1. However, the trench isolation structure 8a is not necessarily required to reach the p⁻ semiconductor substrate 1, whose example is shown in FIG. 9.

Figure 9:
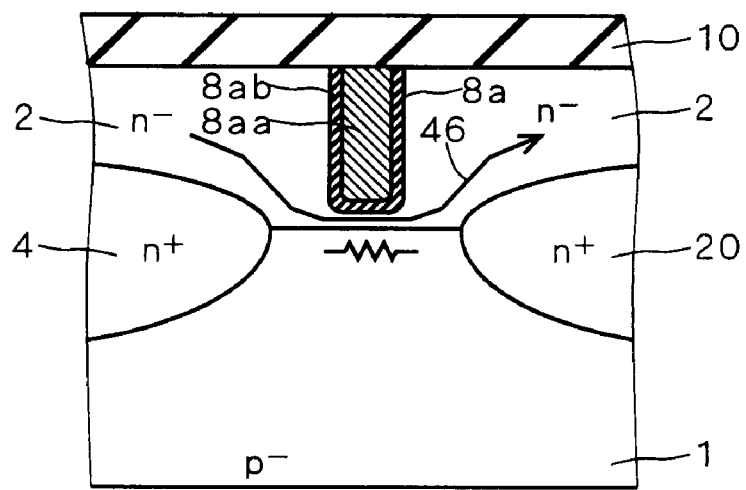

With reference to FIG. 9, the trench isolation structure 8a failing to reach the p⁻ semiconductor substrate 1 causes a source-drain current 46 of the nMOS transistor 103 to partially leak into the n⁻ semiconductor layer 2 defined in the control circuit forming region C. The potential difference between the electrode 17 and the drain electrode 14, that is, the difference between the potential VB and the drain potential V1, is controlled accordingly to a lower level when the nMOS transistor 103 is in on state.

On the other hand, the trench isolation structure 8a which reaches the vicinity of the interface between the n⁻ semiconductor layer 2 and the p⁻ semiconductor substrate 1 causes a leakage current to flow through a narrow current path having large parasitic resistance, whereby reduction in potential difference between the electrode 17 and the drain electrode 14 caused by the leakage current is negligible. In other words, the lower end portion of the trench isolation structure 8a may get close to the interface between the n⁻ semiconductor layer 2 and the p⁻ semiconductor substrate 1, to the extent that reduction in potential difference between the electrode 17 and the drain electrode 14 caused by the leakage current has substantially no influence on the operation of a semiconductor device. More specifically, the distance between the lower end portion of the trench isolation structure 8a and the upper surface of the p⁻ semiconductor substrate 1 is so controlled that the potential difference between the electrode 17 and the drain electrode 14 should not be less than a threshold value of the interlock circuit 108 for detecting this potential difference. The source-drain current 46 of the nMOS transistor 103 will be hereinafter referred to as "MOS current 46".

As discussed, the trench isolation structure 8a is required to extend at least to the vicinity of the interface between the n⁻ semiconductor layer 2 and the p⁻ semiconductor substrate 1. That is, the trench 8ac for forming the trench isolation structure 8a is not necessarily required to reach the p⁻ semiconductor substrate 1, as long as it extends from the upper surface of the n⁻ semiconductor layer 2 to at least the vicinity of the interface with the p⁻ semiconductor substrate 1.

Figure 10:
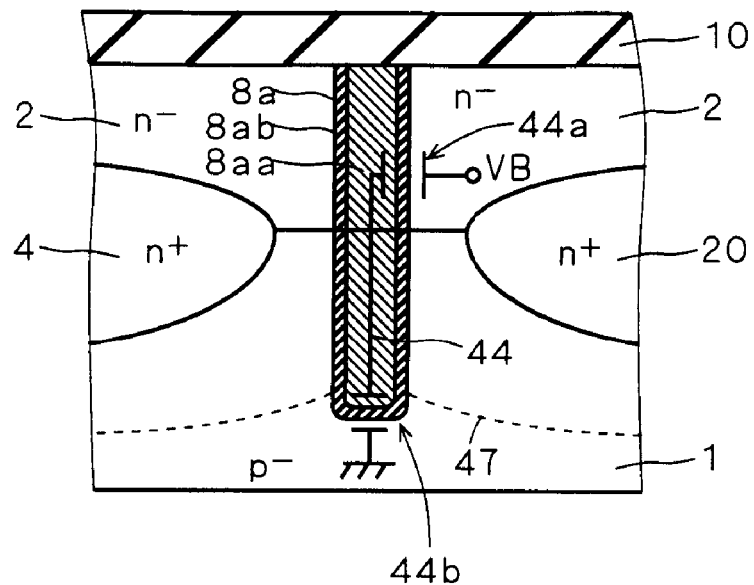

With reference to FIG. 10, the trench isolation structure 8a may extend to a depth greater than the depth of the upper surface of the p⁻ semiconductor substrate 1, reaching a depth sufficiently greater than the greatest possible depth of the n⁺ buried impurity regions 4 and 20. In this case, the following problem will result.

When the p⁻ semiconductor substrate 1 and the n⁻ semiconductor layer 2 are respectively subjected to application of the ground potential GND and the potential VB, a depletion layer is also formed in the p⁻ semiconductor substrate 1. Dashed lines 47 of FIG. 10 show the terminal of such a depletion layer. When the lower end portion of the trench isolation structure 8a reaches a depth greater than the depth of the terminal of the depletion layer, the lower end portion of the trench isolation structure 8a bears the same potential as that of the p⁻ semiconductor substrate 1, that is, the ground potential GND. Accordingly, a leakage current is likely to flow between the n⁻ semiconductor layer 2 and the p⁻ semiconductor substrate 1, passing through the insulating film 8ab on the side surface of the conductive film 8aa of the trench isolation structure 8a, the conductive film 8aa, and the insulating film 8ab on the bottom surface of the conductive film 8aa. Such passage of the leakage current is indicated in FIG. 10 as a current path 44.

The conductive film 8aa which is polysilicon is considerably higher in electrical conductivity than the insulating film 8ab as a silicon oxide film. That is, insulation between the p⁻ semiconductor substrate 1 and the n⁻ semiconductor layer 2 is maintained substantially by the insulating film 8ab defined on the side surface and the bottom surface of the conductive film 8aa. In FIG. 10, an electrostatic capacitance formed by the n⁻ semiconductor layer 2, the conductive film 8aa, and the insulating film 8ab defined therebetween is equivalently indicated as a capacitor 44a. An electrostatic capacitance formed by the conductive film 8aa, the p⁻ semiconductor substrate 1, and the insulating film 8ab defined therebetween is equivalently indicated as a capacitor 44b.

As an example, when the potential VB of 600 V is applied to the n⁻ semiconductor layer 2, the insulating film 8ab is subjected to application of 300 V at one side that maintains insulation between the p⁻ semiconductor substrate 1 and the n⁻ semiconductor layer 2. In order to secure insulation strength for this potential, the insulating film 8ab should be 300 nm at a minimum in thickness. For reliability for long duration, the insulating film 8ab is required to have a thickness twice this value or more.

Due to constraints of wafer processing, difficulty may be found in providing a large thickness of the insulating film 8ab to be formed on the inner surface of the trench 8ac. In this case, the semiconductor device 100 is not allowed to have a capability to withstand a potential of 1000 V or more, as the breakdown voltage of the semiconductor device 100 is controlled by the insulation strength of the insulating film 8ab.

Figure 11:
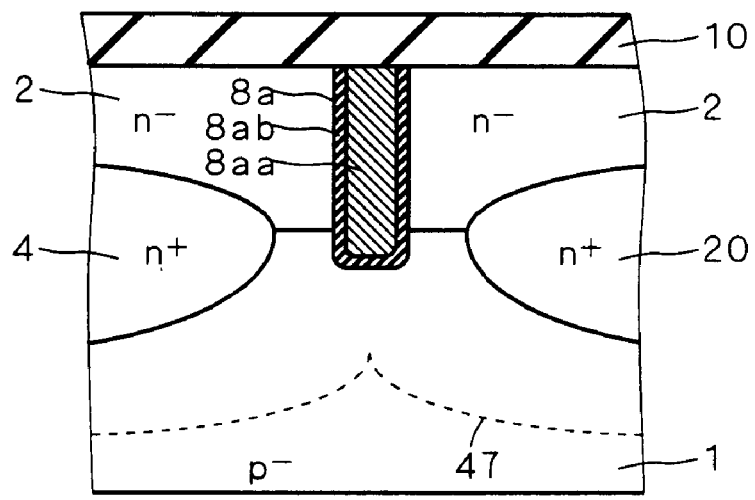

With reference to FIG. 11, the lower end portion of the trench isolation structure 8a thus desirably reaches a depth which is shallower than the greatest possible depth of the n⁺ buried impurity regions 4 and 20, whereby the lower end portion of the trench isolation structure 8a is easily taken into the depletion layer. The n⁻ semiconductor layer 2 has a potential gradient in the depletion layer, and hence the foregoing potential difference is unlikely between the n⁻ semiconductor layer 2 and the lower end portion of the trench isolation structure 8a. As a result, the insulating film 8ab is not required to have a great thickness, to thereby easily realize improvement in breakdown voltage of the semiconductor device 100.

Figure 12:
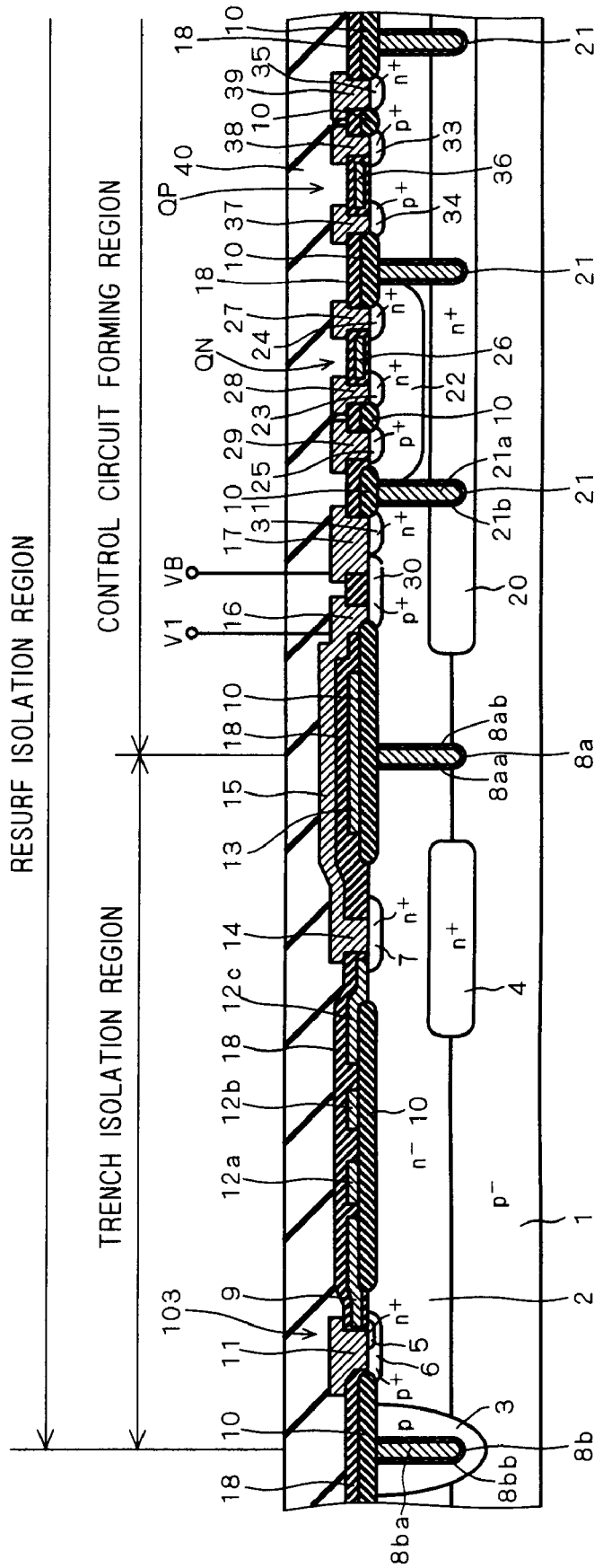
FIG. 12 is a sectional view of the structure of the semiconductor device according to the first preferred embodiment.
Figure 13:
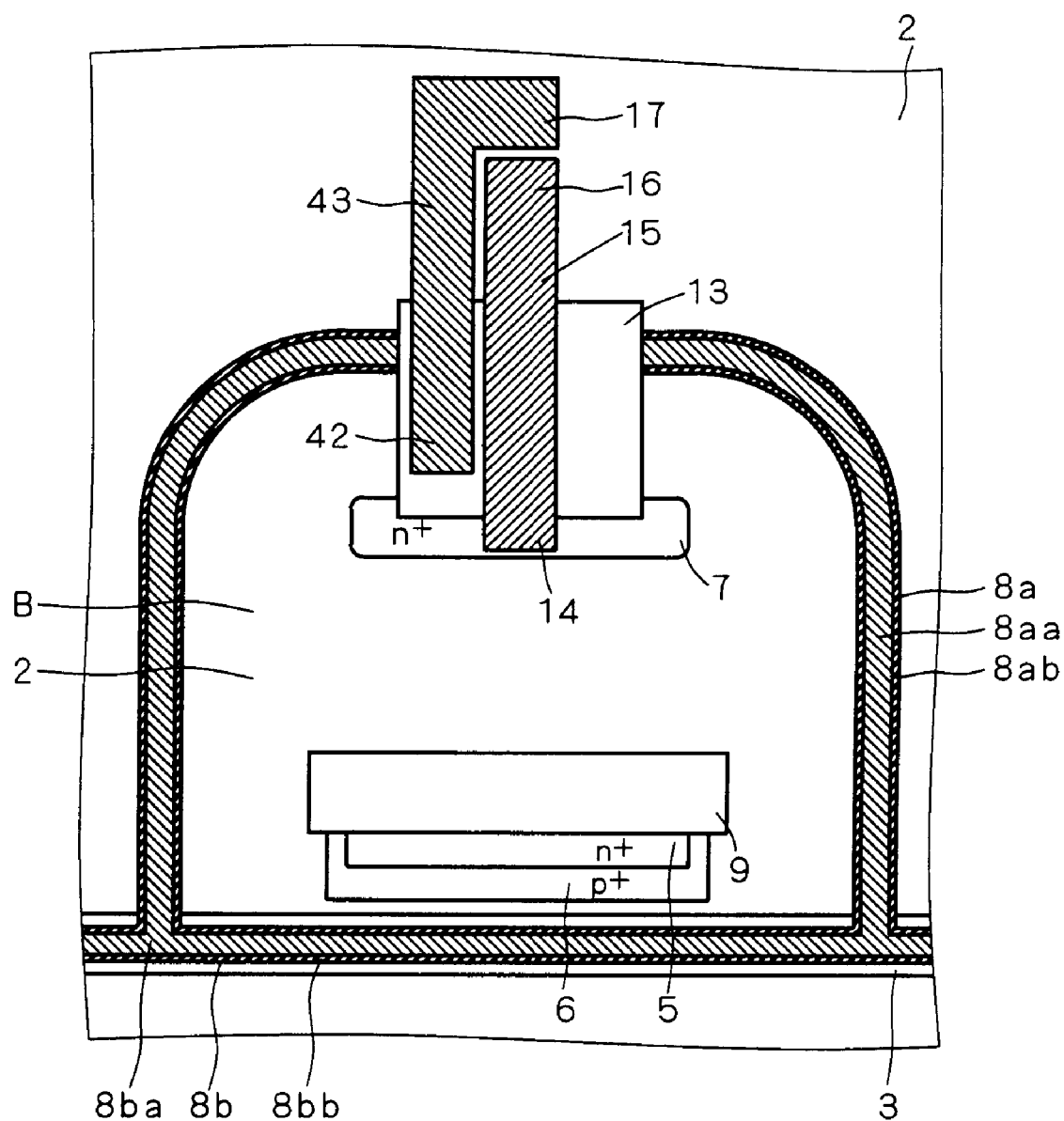
FIG. 13 is a plan view of the structure of the semiconductor device according to the first preferred embodiment.

In the first preferred embodiment, the field plate 13 is electrically connected to the n⁻ semiconductor layer 2 defined in the trench isolation region B. The field plate 13 may alternatively be a floating electrode insulated from its surrounding, as shown in FIG. 12. The field plate 13 may further alternatively be electrically connected to the n⁻ semiconductor layer 2 defined in the control circuit forming region C. FIG. 13 more specifically shows this alternative. An electrode 42 penetrating the insulating film 18 is provided to be in contact with the field plate 13 provided between the interconnect line 15 and the trench isolation structure 8a. An interconnect line 43 provided on the insulating film 18 is operative to connect the electrodes 42 and 17. As an example, the electrode 42 and the interconnect line 43 include aluminum. The field plate 13 is thereby electrically connected to the n⁻ semiconductor layer 2 defined in the control circuit forming region C.

The structures shown in FIGS. 12 and 13 are also operative to shield the trench isolation structure 8a from the electric field of the interconnect line 15, thus suppressing drop in breakdown voltage caused by the electric field from the interconnect line 15.

The first preferred embodiment requires the trench isolation structure 8b which extends along the perimeter of the RESURF isolation region A. Insulation in the n⁻ semiconductor layer 2 between the trench isolation region B and the control circuit forming region C may be established by an alternative way. As an example, the trench isolation structure 8a connected to the p impurity region 3 also results in such insulation. Accordingly, the trench isolation structure 8b is not an indispensable element.

Second Preferred Embodiment

Figure 14:
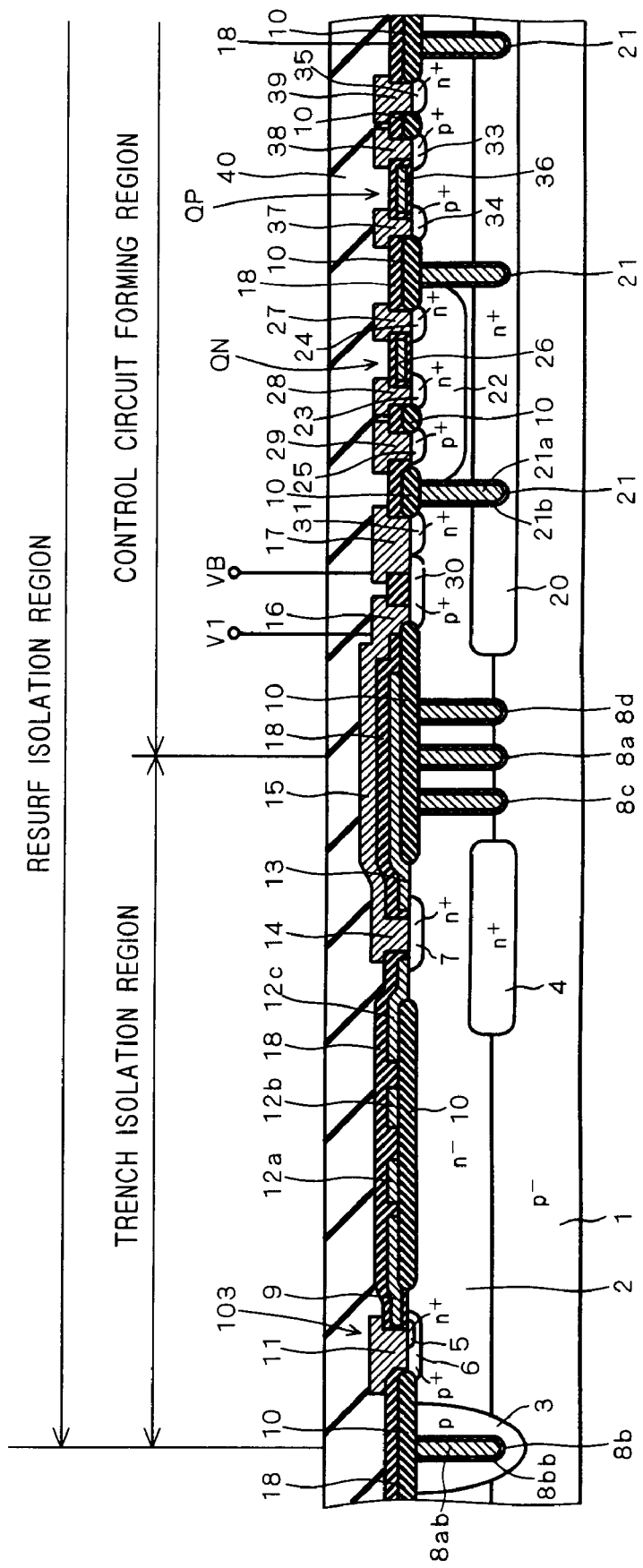
FIG. 14 is a sectional view of the structure of a semiconductor device according to a second preferred embodiment of the present invention.
Figure 15:
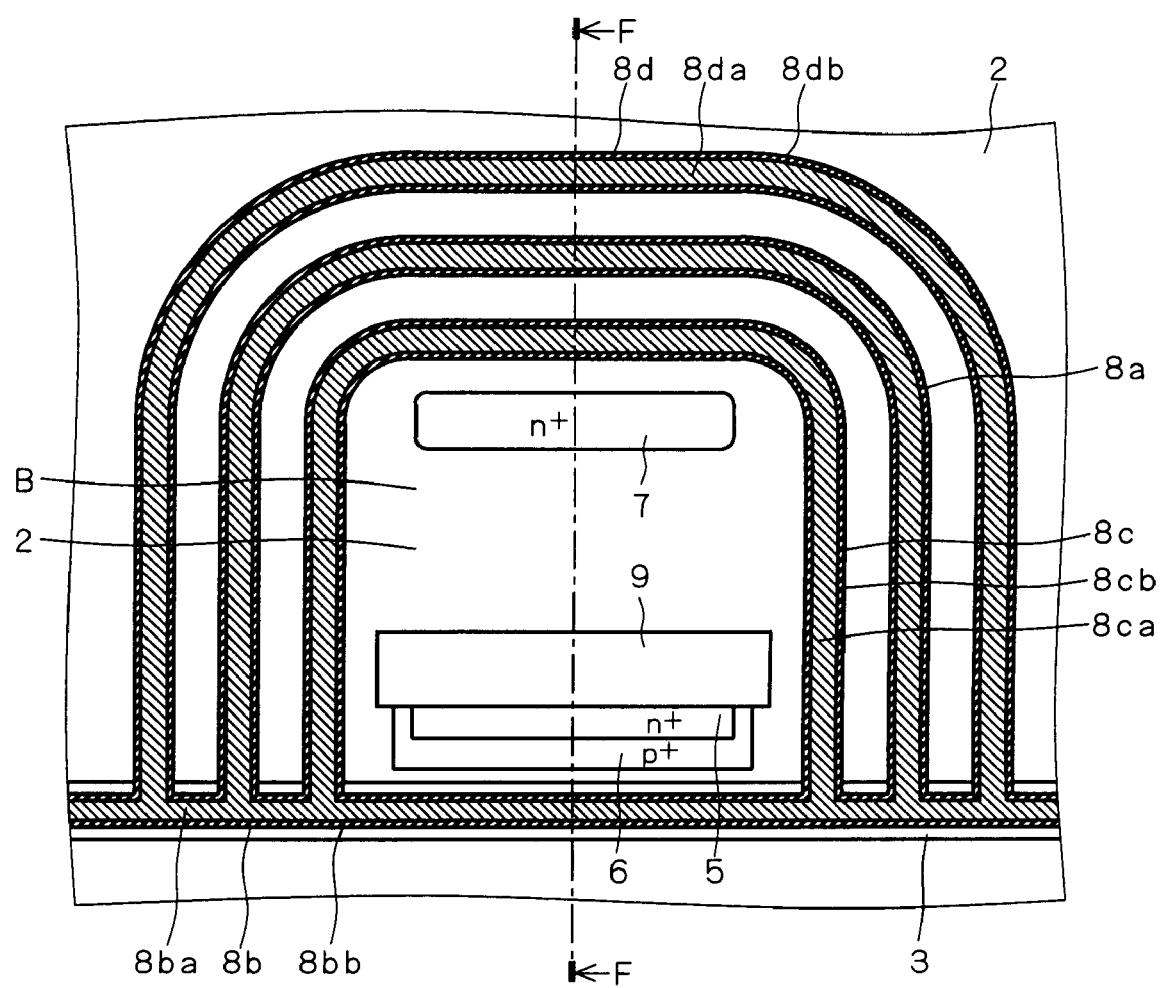
FIG. 15 is a plan view of the structure of the semiconductor device according to the second preferred embodiment.

FIGS. 14 and 15 are a sectional view and a plan view, respectively, of the structure of a semiconductor device according to a second preferred embodiment of the present invention. The cross section of FIG. 14 is taken along a line corresponding to the arrowed line D-D of FIG. 2. Except for the gate electrode 9, the structure over the n⁻ semiconductor layer 2 (including the isolation insulating film 10) is omitted from FIG. 15. The left half of the sectional view of FIG. 14 is taken along an arrowed line F-F of FIG. 15.

The semiconductor device of the second preferred embodiment incorporates trench isolation structures 8c and 8d into the semiconductor device 100 of the first preferred embodiment.

With reference to FIGS. 14 and 15, the trench isolation structure 8c is provided in the n⁻ semiconductor layer 2 defined between the trench isolation structure 8a and the n⁺ buried impurity region 4, extending from the upper surface of the n⁻ semiconductor layer 2 to reach the interface with the p⁻ semiconductor substrate 1. The trench isolation structures 8c and 8a are separated by a certain distance. The trench isolation structure 8d is provided in the n⁻ semiconductor layer 2 defined between the trench isolation structure 8a and the n⁺ buried impurity region 20, extending from the upper surface of the n⁻ semiconductor layer 2 to reach the interface with the p⁻ semiconductor substrate 1. The trench isolation structures 8d and 8a are separated by a certain distance.

The trench isolation structures 8c and 8d are connected to the p impurity region 3. Together with the trench isolation structure 8a and the p impurity region 3, the trench isolation structures 8c and 8d are operative to define the trench isolation region B which includes therein the nMOS transistor 103 in the n⁻ semiconductor layer 2.

The trench isolation structure 8c includes a conductive film 8ca and an insulating film 8cb. The trench isolation structure 8d includes a conductive film 8da and an insulating film 8db. The conductive films 8ca and 8da, which may be polysilicon films, for example, are arranged in the n⁻ semiconductor layer 2, extending from the upper surface of the n⁻ semiconductor layer 2 to reach the interface with the p⁻ semiconductor substrate 1. The conductive film 8ca is covered with the insulating film 8cb, at the surface buried in the n⁻ semiconductor layer 2 and the p⁻ semiconductor substrate 1. The conductive film 8da is covered with the insulating film 8db, at the surface buried in the n⁻ semiconductor layer 2 and the p⁻ semiconductor substrate 1. The insulating films 8cb and 8db may be silicon oxide films, for example. The other constituent elements are the same as those of the semiconductor device 100 of the first preferred embodiment, and hence, the description thereof will be omitted.

In the semiconductor device of the second preferred embodiment, the trench isolation structures 8a, 8c and 8d form a multilayer structure as discussed. Leakage of the source-drain current of the nMOS transistor 103 into the n⁻ semiconductor layer 2 in the control circuit forming region C is thus less likely. As a result, the pulse signal P1 given to the gate electrode 9 of the nMOS transistor 103 can be shifted to a higher potential level with higher reliability.

Third Preferred Embodiment

When semiconductor device 100 is to be improved further in capability concerning a breakdown voltage, the first preferred embodiment may suffer from a problem involving insulation between the p impurity region 3 and the n⁺ impurity region 7 respectively subjected to application of the ground potential GND and a high potential. This problem will be discussed with reference to FIG. 16.

Figure 16:
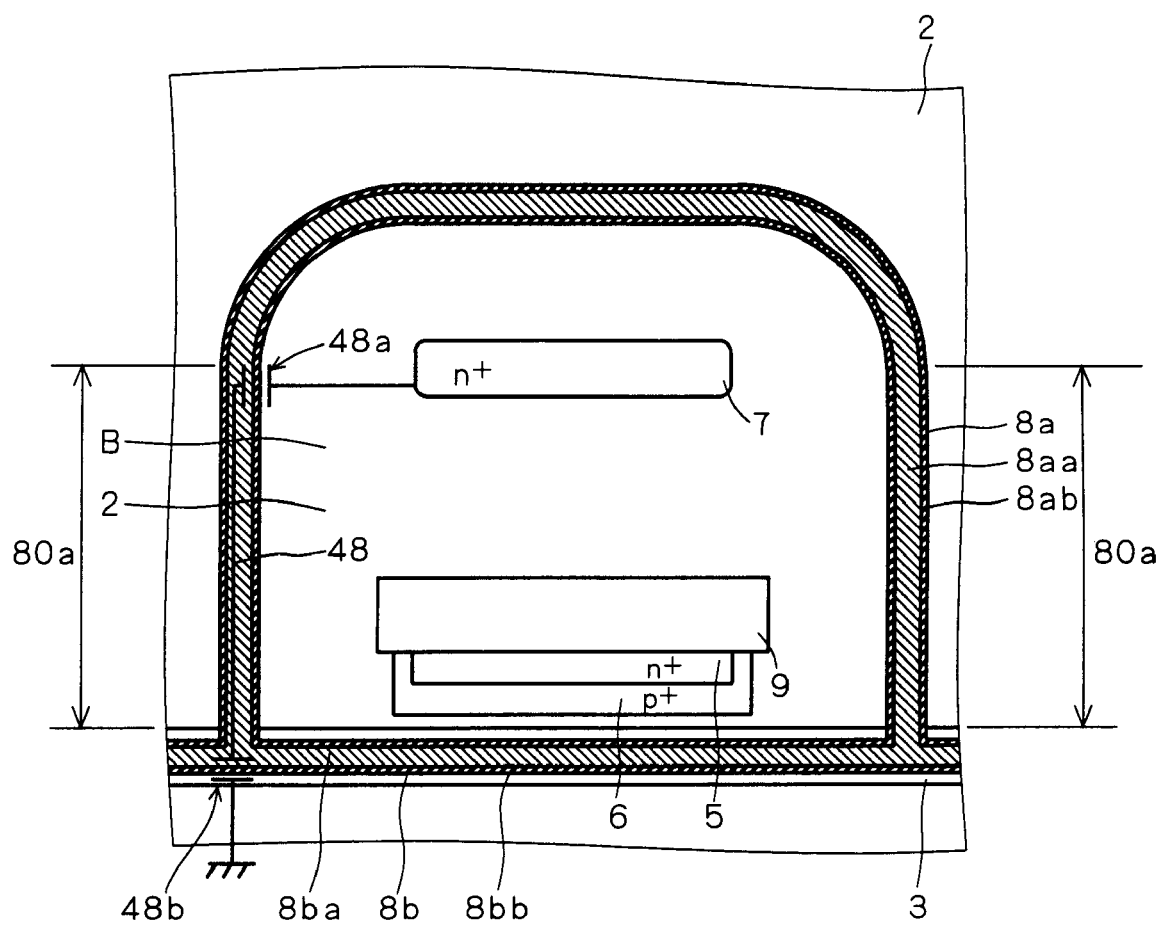
FIG. 16 is a plan view of the structure of the semiconductor device according to the first preferred embodiment.

FIG. 16 is a plan view of the structure of the semiconductor device 100 according to the first preferred embodiment. The field plate 13, the interconnect line 15, and the drain electrode 14 shown in FIG. 4 are omitted from FIG. 16.

When a high potential and the ground potential GND are respectively applied to the n⁺ impurity region 7 and the p impurity region 3, a depletion layer is formed to extend almost entirely in the n⁻ semiconductor layer 2 defined between the p impurity region 3 and the n⁺ buried impurity region 4 as discussed. This causes a leakage current to easily pass through in-line portions 80a of the trench isolation structure 8a and the trench isolation structure 8b connected thereto, flowing between the n⁺ impurity region 7 and the p impurity region 3. Such passage of the leakage current is indicated in FIG. 16 as a current path 48.

As shown in FIG. 16, the in-line portions 80a start from the p impurity region 3, extending along the direction from the source region 5 towards the n⁺ impurity region 7, namely, in a direction from the p impurity region 3 towards the n⁺ impurity region 7. The in-line portions 80a are opposite to each other, while holding the n⁻ semiconductor layer 2 in the trench isolation region B therebetween.

The conductive film 8aa is connected to the conductive film 8ba of the trench isolation structure 8b at the in-line portions 80a. The conductive films 8aa and 8ba are considerably higher in electrical conductivity than the insulating films 8ab and 8bb. That is, insulation between the n⁺ impurity region 7 and the p impurity region 3 is maintained substantially by the insulating film 8ab defined on the side surface of the conductive film 8aa at the in-line portions 80a, and the insulating film 8bb defined on the conductive film 8ba. In FIG. 16, an electrostatic capacitance formed by the n⁻ semiconductor layer 2, the conductive film 8aa, and the insulating film 8ab defined therebetween is equivalently indicated as a capacitor 48a. An electrostatic capacitance formed by the conductive film 8ba, the p impurity region 3, and the insulating film 8bb defined therebetween is equivalently indicated as a capacitor 48b.

As discussed in the first preferred embodiment, the insulating films 8ab and 8bb should be considerably large in thickness in response to application of a high potential to the n⁻ semiconductor layer 2 which may be 600 V, for example. Due to constraints of wafer processing, difficulty may be found in providing a large thickness of the insulating films 8ab and 8bb. In this case, the semiconductor device 100 provided with a high breakdown voltage is unlikely.

In response, a third preferred embodiment of the present invention suggests a technique which allows improved insulation between the p impurity region 3 and the n⁺ impurity region 7.

Figure 17:
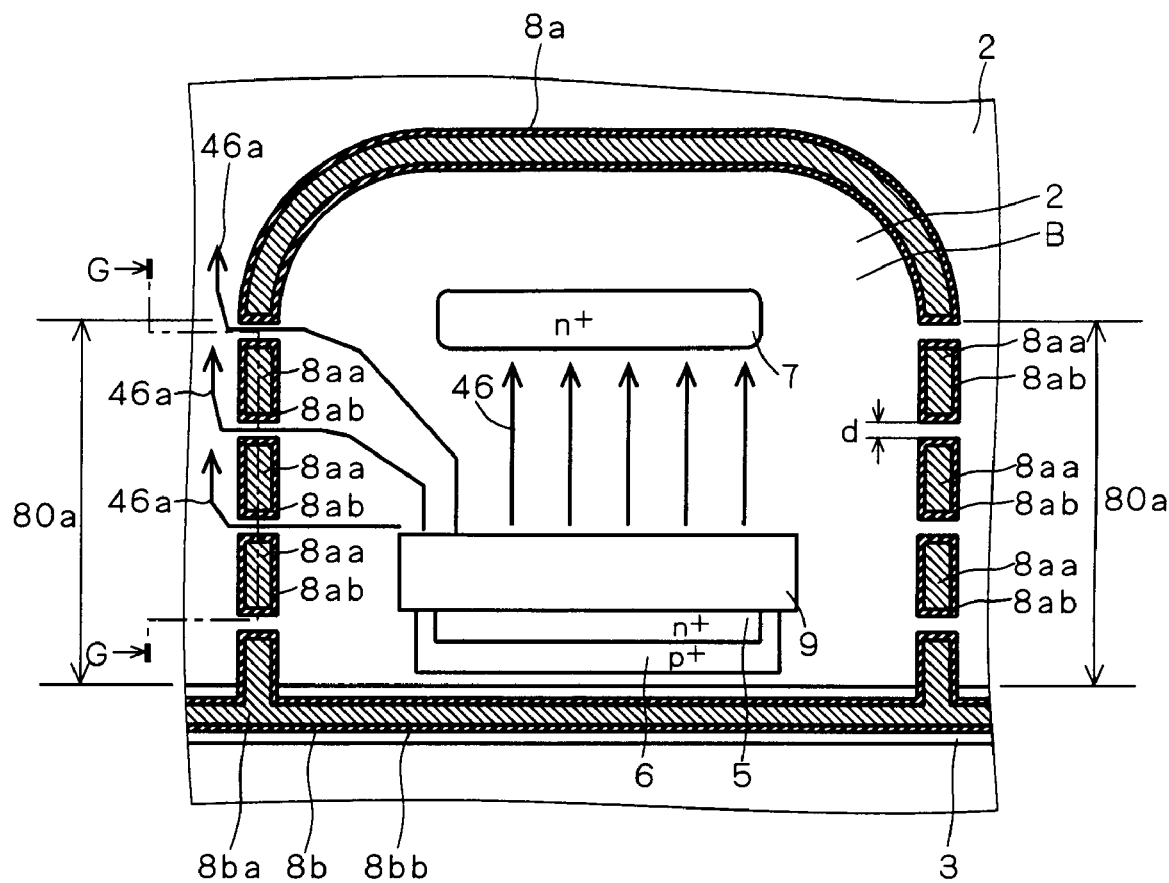
FIG. 17 is a plan view of the structure of a semiconductor device according to a third preferred embodiment of the present invention.
Figure 18:
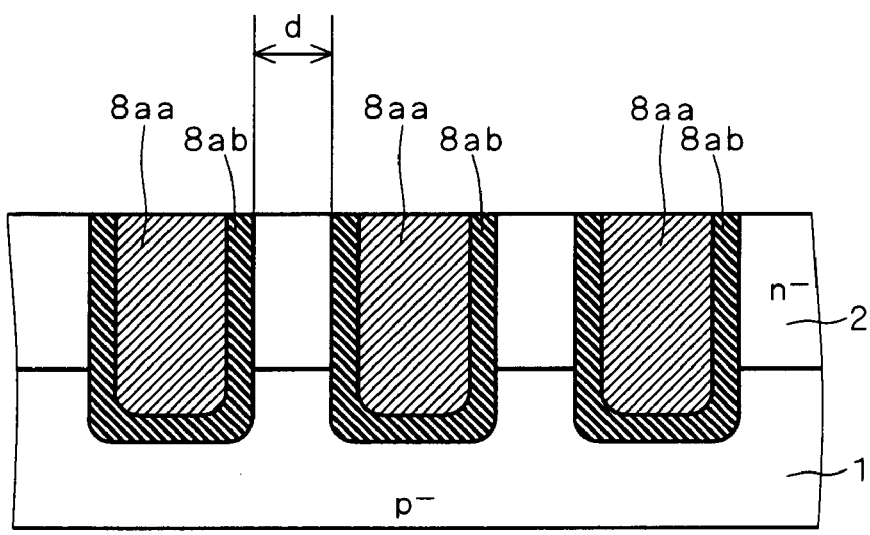
FIGS. 18 and 19 are sectional views of the structure of the semiconductor device according to the third preferred embodiment.

FIG. 17 is a plan view of the structure of a semiconductor device according to the third preferred embodiment. FIG. 18 is a sectional view taken along an arrowed line G-G of FIG. 17. In the semiconductor device of the third preferred embodiment, the in-line portions 80a of the trench isolation structure 8a in the first preferred embodiment are fragmented, the detail of which will be discussed below. Except for the gate electrode 9, the structure over the n⁻ semiconductor layer 2 (including the isolation insulating film 10) is omitted from FIG. 17.

With reference to FIGS. 17 and 18, the in-line portions 80a of the trench isolation structure 8a each include a plurality of spaced-apart conductive films 8aa. The conductive films 8aa are covered with respective insulating films 8ab, at the surfaces buried in the n⁻ semiconductor layer 2 and the p⁻ semiconductor substrate 1. Adjacent ones of the insulating films 8ab are separated by a certain distance d. Here, the distance d is the space between the side surface of one insulating film 8ab opposite to the surface thereof which covers the corresponding conductive film 8aa, and the side surface of the other insulating film 8ab facing the former insulating film 8ab, opposite to the surface thereof which covers the corresponding conductive film 8aa.

In the semiconductor device of the third preferred embodiment, the in-line portions 80a of the trench isolation structure 8a each include the plurality of spaced-apart conductive films 8aa which are covered with respective insulating films 8ab, at the surfaces buried in the n⁻ semiconductor layer 2 and the p⁻ semiconductor substrate 1. With reference to a leakage current which is likely pass through the in-line portions 80a to flow between the n⁺ impurity region 7 and the p impurity region 3, such a leakage current is caused to flow through the insulating films 8ab provided to respective conductive films 8aa accordingly. As compared with the semiconductor device 100 of the first preferred embodiment in which the conductive film 8aa is not divided in the in-line portions 80a, such a leakage current passes a larger number of insulating films 8ab. Besides the capacitors 48a and 68b, this results in a plurality of capacitors when shown in an equivalent circuit diagram that are connected in series in the passage of the leakage current between the $n^+$ impurity region 7 and the p impurity region 3. The leakage current is hence hard to flow, leading to improved insulation between the $n^+$ impurity region 7 and the p impurity region 3 and eventually, to a semiconductor device with a higher breakdown voltage.

In the third preferred embodiment, adjacent ones of the insulating films 8ab in each in-line portion 80a are separated by the distance d, causing part 46a of the MOS current 46 to pass through openings between adjacent insulating films 8ab to leak into the $n^-$ semiconductor layer 2 defined in the control circuit forming region C. Accordingly, the potential difference is reduced between the electrode 17 and the drain electrode 14 when the nMOS transistor 103 is in on state. In response, the distance d between adjacent insulating films 8ab is so controlled that such reduction in potential difference causes substantially no influence on the operation of a semiconductor device. The part 46a of the MOS current 46 which leaks into the $n^-$ semiconductor layer 2 in the control circuit forming region C will be hereinafter referred to as "leakage current 46a".

Figure 19:
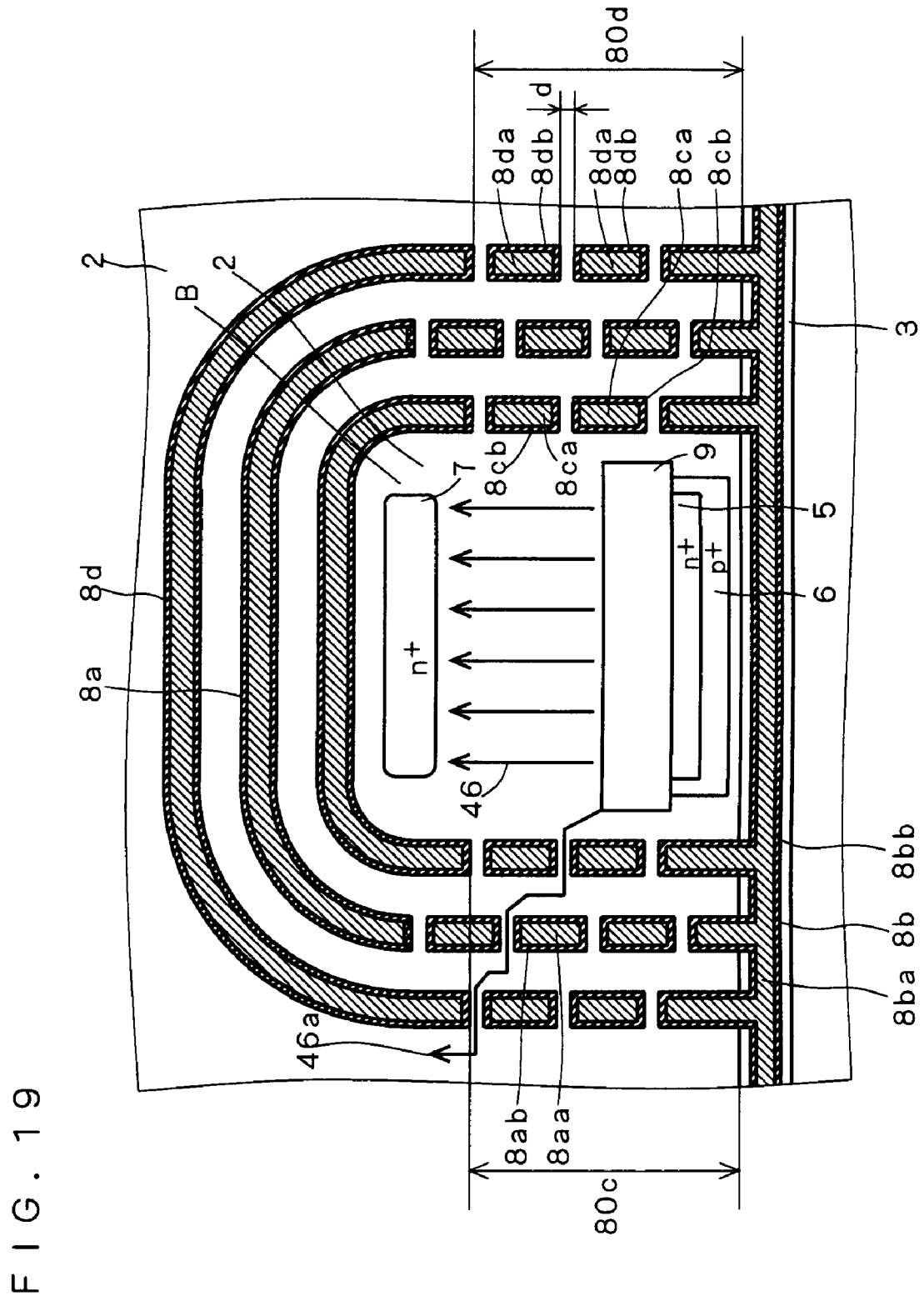

In the third preferred embodiment, the trench isolation structure 8a of the first preferred embodiment is partially fragmented. The trench isolation structures 8a, 8c and 8d of the second preferred embodiment shown in FIG. 15 may also be partially fragmented. FIG. 19 is a plan view of the semiconductor device according to the third preferred embodiment in which the trench isolation structures 8a, 8c and 8d are partially fragmented.

With reference to FIG. 19, like the trench isolation structure 8a of FIG. 17, the trench isolation structure 8a is partially fragmented. In-line portions 80c of the trench isolation structure 8c each include a plurality of spaced-apart conductive films 8ca. In-line portions 80d of the trench isolation structure 8d each include a plurality of spaced-apart conductive films 8da.

Like the in-line portions 80a, the in-line portions 80c extend from the p impurity region 3 towards the $n^+$ impurity region 7. The in-line portions 80c are opposite to each other, while holding the $n^-$ semiconductor layer 2 in the trench isolation region B therebetween. Like the in-line portions 80a and 80c, the in-line portions 80d extend from the p impurity region 3 towards the $n^+$ impurity region 7. The in-line portions 80d are opposite to each other, while holding the $n^-$ semiconductor layer 2 in the trench isolation region B therebetween.

In each one of the in-line portions 80c of the trench isolation structure 8c, the conductive films 8ca are covered with respective insulating films 8cb, at the surfaces buried in the $n^-$ semiconductor layer 2 and the $p^-$ semiconductor substrate 1. Adjacent ones of the insulating films 8cb are separated by the distance d. Here, the distance d is the space between the side surface of one insulating film 8cb opposite to the surface thereof which covers the corresponding conductive film 8ca, and the side surface of the other insulating film 8cb facing the former insulating film 8cb, opposite to the surface thereof which covers the corresponding conductive film 8ca.

In each one of the in-line portions 80d of the trench isolation structure 8d, the conductive films 8da are covered with respective insulating films 8db, at the surfaces buried in the $n^-$ semiconductor layer 2 and the $p^-$ semiconductor substrate 1. Adjacent ones of the insulating films 8db are separated by the distance d. Here, the distance d is the space between the side surface of one insulating film 8db opposite to the surface thereof which covers the corresponding conductive film 8da, and the side surface of the other insulating film 8db facing the former insulating film 8db, opposite to the surface thereof which covers the corresponding conductive film 8da.

When the trench isolation structures 8a, 8c and 8d are each partially fragmented, the leakage current 46a is reduced in the semiconductor device of the second preferred embodiment. This is because the MOS current 46 should pass through the openings between adjacent insulating films 8cb and between adjacent insulating films 8db, in addition to the openings between adjacent insulating films 8ab to leak into the $n^-$ semiconductor layer 2 in the control circuit forming region C, thus causing increase in resistance value in the passage for the leakage current 46a. As a result, the distance d is allowed to be greater than the distance d in the semiconductor device of in FIG. 17, leading to improved design flexibility of the distance d.

With reference to FIG. 19, when the trench isolation structures 8a, 8c and 8d are partially fragmented as discussed, the openings between the insulating films 8ab and those between the insulating films 8cb may be displaced from each other in a direction from the source region 5 towards the $n^+$ impurity region 7. The openings between the insulating films 8ab and those between the insulating films 8db may also be displaced from each other in the direction from the source region 5 towards the $n^+$ impurity region 7. Such displacement results in longer passage of the leakage current 46a as seen from FIG. 19 and increased resistance value in this passage, to thereby reduce the leakage current 46a to a greater degree.

Fourth Preferred Embodiment

Figure 20:
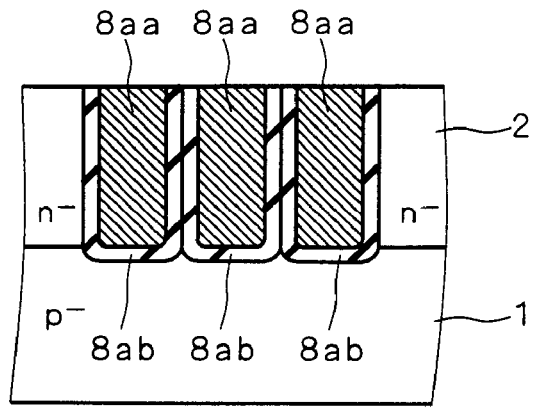
FIG. 20 is a sectional view of a trench isolation structure 8a according to a fourth preferred embodiment of the present invention.

FIG. 20 is a sectional view of the structure of a semiconductor device according to a fourth preferred embodiment of the present invention, taken along a line corresponding to the arrowed line G-G of FIG. 17. With reference to FIG. 20, the semiconductor device of the fourth preferred embodiment differs from the semiconductor device of the third preferred embodiment in that the openings between adjacent conductive films 8aa are filled with the insulating films 8ab in the in-line portions 80a. The other configuration is the same as the one of the third preferred embodiment, and hence, the description thereof will be omitted.

In the fourth preferred embodiment, the openings between the spaced-apart conductive films 8aa are filled with the insulating films 8ab, whereby reduction in leakage current 46a can be encouraged further as compared with the semiconductor device of the third preferred embodiment.

Figure 21:
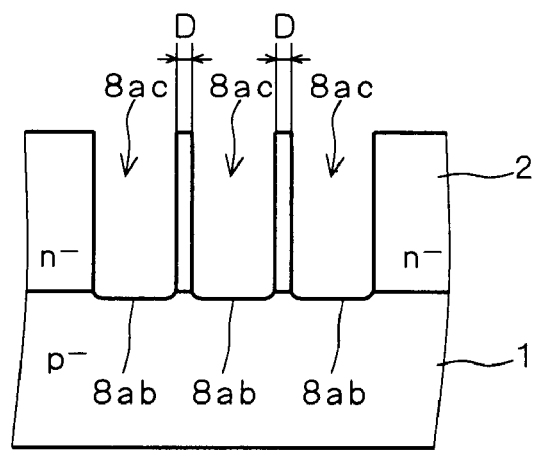
FIGS. 21 and 22 are sectional views showing a method of forming the trench isolation structure 8a according to the fourth preferred embodiment.
Figure 22:
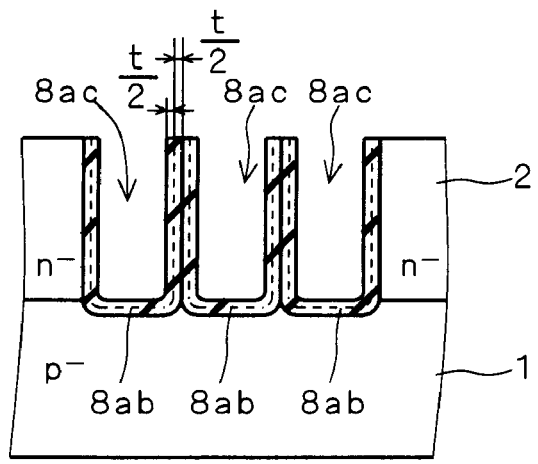

It will be discussed next how the structure of FIG. 20 is formed, and the process steps thereof are shown in FIGS. 21 and 22. Like FIG. 20, the cross sections of FIGS. 21 and 22 are each taken along a line corresponding to the arrowed line G-G of FIG. 17.

With reference to FIG. 21, the $n^-$ semiconductor layer 2 is provided on the $p^-$ semiconductor substrate 1. A plurality of trenches 8ac are thereafter formed in the $n^-$ semiconductor layer 2 to extend from the upper surface of the $n^-$ semiconductor layer 2 to reach the interface with the $p^-$ semiconductor substrate 1. The plurality of trenches 8ac are separated by a certain distance. Referring to two trenches 8ac adjacent to each other, a distance D between the side surface of one trench 8ac and the side surface of the other trench 8ac facing the former trench 8ac is controlled to be not more than a thickness t of the insulating films 8ab to be formed in the subsequent step.

With reference to FIG. 22, the respective inner walls of the trenches 8ac are oxidized next to form the insulating films 8ab on the respective inner surfaces of the trenches 8ac. More particularly, half the thickness of the insulating films 8ab is formed on the inner surfaces of the n⁻ semiconductor layer 2 and the p⁻ semiconductor substrate 1 exposed by the trenches 8ac, and the other half thereof is formed inside the surfaces of the n⁻ semiconductor layer 2 and the p⁻ semiconductor substrate 1. The distance D between adjacent trenches 8ac is controlled to be not more than the thickness t of the insulating films 8ab, whereby the insulating films 8ab formed on the respective inner surfaces of adjacent trenches 8ac are in contact with each other. In FIG. 22, the inner surfaces of the trenches 8ac prior to formation of the insulating films 8ab are represented by dashed lines.

Thereafter, the conductive films 8aa are provided to fill the trenches 8ac, to reach the structure shown in FIG. 20.

As discussed, by controlling the distance D between adjacent trenches 8ac to be not more than the thickness t of the insulating films 8ab, the openings between adjacent conductive films 8aa are filled with the insulating films 8ab. The leakage current 46a can be reduced accordingly.

Fifth Preferred Embodiment

The semiconductor device of the third preferred embodiment experiences generation of the openings between the insulating films 8ab of each in-line portion 80a, which results in increased leakage current 46a with the increased distance d as shown in FIG. 23. In view of this, measurement of the leakage current 46a is required to evaluate manufacturing process of the in-line portions 80a of the trench isolation structure 8a. On the other hand, it is difficult to measure only the leakage current 46a directly.

In response, in a fifth preferred embodiment of the present invention, a plurality of test structures 53 are provided to the semiconductor device of the third preferred embodiment, to thereby evaluate manufacturing process of the in-line portions 80a of the trench isolation structure 8a.

Figure 24:
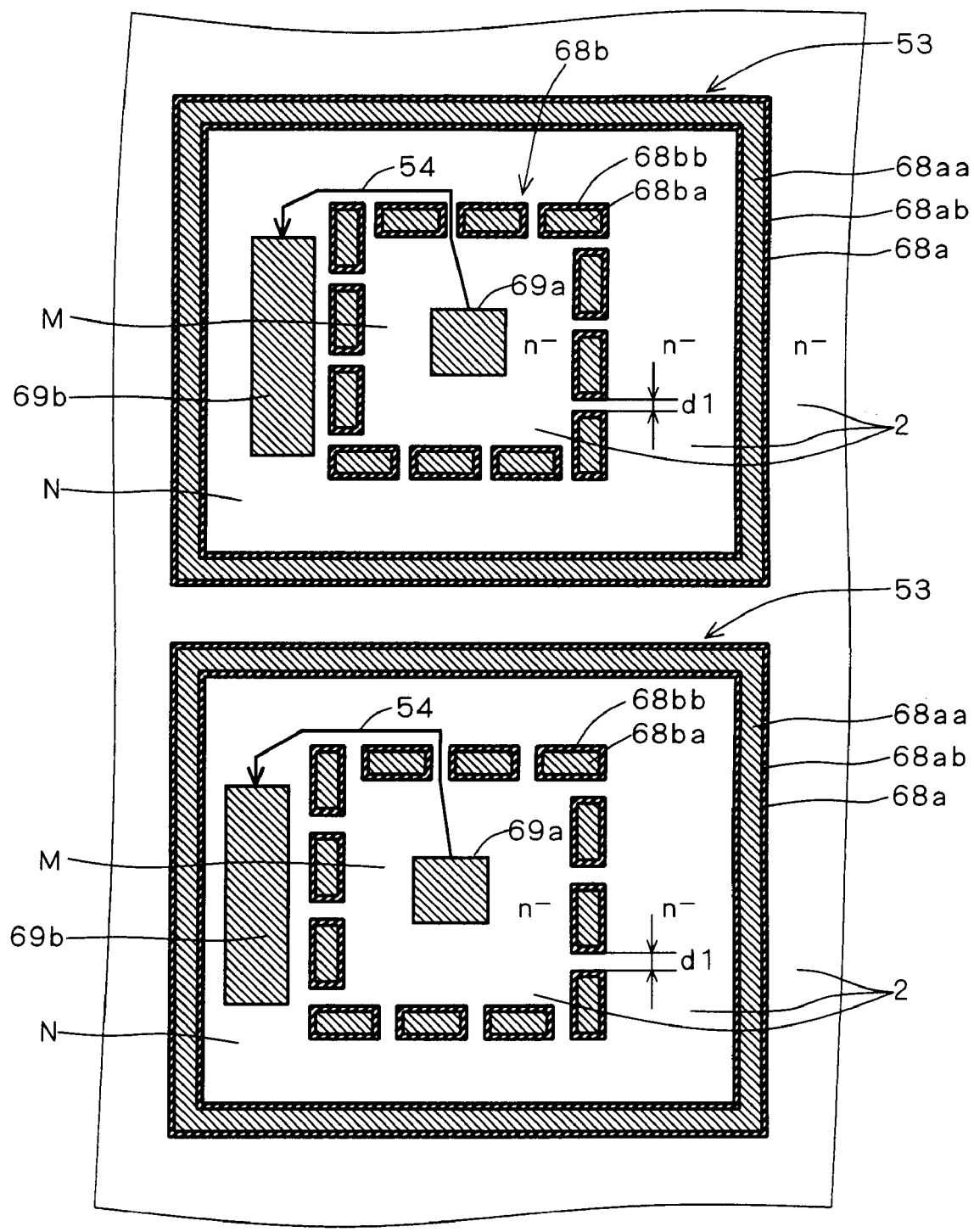
FIG. 24 is a plan view of test structures 53 according to a fifth preferred embodiment of the present invention.

Details of the test structures 53 will be discussed first. With reference to FIG. 24, the test structures 53 provided to the semiconductor device of the third preferred embodiment each comprise trench isolation structures 68a and 68b, and electrode pads 69a and 69b. The trench isolation structure 68b is provided in the n⁻ semiconductor layer 2, extending from the upper surface of the n⁻ semiconductor layer 2 to reach the interface with the p⁻ semiconductor substrate 1. The trench isolation structure 68b surrounds a part of the n⁻ semiconductor layer 2, to define a region M therein.

The trench isolation structure 68b includes a plurality of conductive films 68ba arranged along the perimeter of the region M. Like the conductive films 8aa of the trench isolation structure 8a, the conductive films 68ba are provided in the n⁻ semiconductor layer 2, extending from the upper surface of the n⁻ semiconductor layer 2 to reach the interface with the p⁻ semiconductor substrate 1. The conductive films 68ba are covered with respective insulating films 68bb, at the surfaces buried in the n⁻ semiconductor layer 2 and the p⁻ semiconductor substrate 1. The insulating films 68bb are separated from each other.

The extension of the opening between adjacent insulating films 68bb differs between the plurality of test structures 53. More particularly, referring to two insulating films 68bb adjacent to each other, a distance d1 differs between the plurality of test structures 53 which is the space between the side surface of one insulating film 68bb opposite to the surface thereof which covers the corresponding conductive film 68ba, and the side surface of the other insulating film 68bb facing the former insulating film 68bb, opposite to the surface thereof which covers the corresponding conductive film 68ba. With reference to two test structures 53 shown in FIG. 24, the distance d1 in the upper one is smaller than the distance d1 in the lower one.

The trench isolation structure 68a is provided in the n⁻ semiconductor layer 2 to surround the trench isolation structure 68b, extending from the upper surface of the n⁻ semiconductor layer 2 to reach the interface with the p⁻ semiconductor substrate 1. The trench isolation structure 68a includes a conductive film 68aa and an insulating film 68ab. Like the conductive films 68ba of the trench isolation structure 68b, the conductive film 68aa is provided in the n⁻ semiconductor layer 2, extending from the upper surface of the n⁻ semiconductor layer 2 to reach the interface with the p⁻ semiconductor substrate 1. The conductive film 68aa is covered with the insulating film 68ab, at the surface buried in the n⁻ semiconductor layer 2 and the p⁻ semiconductor substrate 1.

In the region M, the electrode pad 69a is provided on the upper surface of the n⁻ semiconductor layer 2. The electrode pad 69b is provided on the upper surface of the n⁻ semiconductor layer 2 defined between the trench isolation structures 68a and 68b.

As an example, conductive films 68aa and 68ba are polysilicon films, the insulating films 68ab and 68bb are silicon oxide films, and the electrode pads 69a and 69b are aluminum pads.

As an example, the plurality of test structures 53 are provided above the end portion of the p⁻ semiconductor substrate 1 which may be a wafer. There are no insulating films 18 and 40 on the test structures 53. The trench isolation structures 68a and 68b of each test structure 53 are formed concurrently with the trench isolation structure 8a.

The test structures 53 are operative to function as a monitor to evaluate manufacturing process of the in-line portions 80a of the trench isolation structure 8a, and hence, the trench isolation structure 68b of each test structure 53 and the in-line portions 80a are formed under the same conditions. The conductive films 68ba of the trench isolation structure 68b and the conductive films 8aa at each in-line portion 80a are formed into the same shape. The insulating films 68bb of the trench isolation structure 68b and the insulating films 8ab at each in-line portion 80a are formed into the same thickness.

By way of example, the fourth preferred embodiment includes three test structures 53. In one test structure 53, the distance d1 between the insulating films 68bb of the trench isolation structure 68b is the same as the distance d between the insulating films 8ab at the in-line portions 80a. In the remaining two test structures 53, the distance d1 is greater and smaller than the distance d, respectively. The test structure 53 having the distance d1 which is the same as the distance d will be hereinafter referred to as "test structure 53a", whereas the test structures 53 having the d1 greater and smaller than the distance d will be respectively referred to as "test structure 53b" and "test structure 53c".

Figure 25:
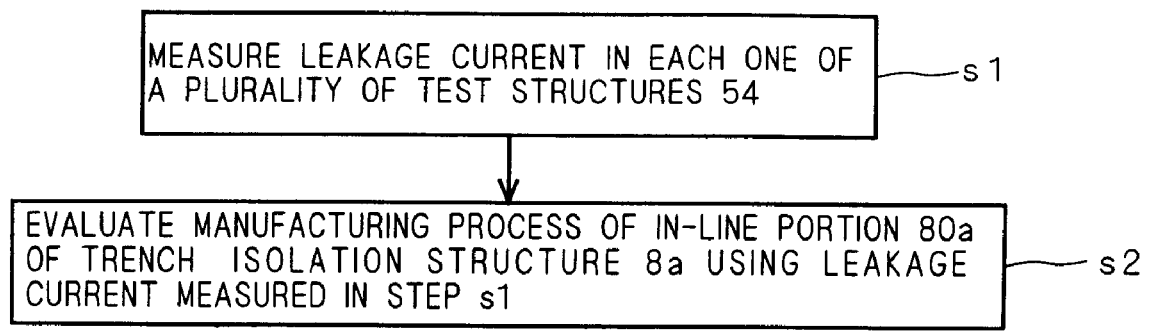
FIG. 25 is a flowchart showing a method of evaluating manufacturing process according to the fifth preferred embodiment.

Next, it will be discussed how the manufacturing process of the in-line portions 80a of the trench isolation structure 8a is evaluated using the test structures 53. FIG. 25 is a flowchart showing a method of evaluating manufacturing process of the in-line portions 80a using the test structures 53. As an example, evaluation of the manufacturing process of the in-line portions 80a is performed in the p⁻ semiconductor substrate 1 which is a wafer.

With reference to FIG. 25, in each one of the plurality of test structures 53, a leakage current 54 is measured in step s1 that flows between the n⁻ semiconductor layer 2 in the region M and the n⁻ semiconductor layer 2 opposite to the region M with respect to the trench isolation structure 68b. More specifically, in each one of the test structures 53a, 53b and 53c, the potential VB and the ground potential GND are respectively applied to the electrode pads 69a and 69b, for example, whereby the current flowing between the electrode pads 69a and 69b are measured.

Using the leakage current 54 measured in step s1, the manufacturing process of the in-line portions 80a of the trench isolation structure 8a is thereafter evaluated in step s2. The example of evaluation will be discussed in detail below.

First, it is judged whether the leakage current 54 measured in step s1 falls within a previously-specified range ref for the leakage current 46a of the nMOS transistor 103. The specified range ref is an allowable range for the leakage current 46a. With the leakage current 46a falling within the specified range ref, reduction in potential difference between the electrode 17 and the drain electrode 14 has no substantial influence on the operation of a semiconductor device, which reduction is caused by the leakage current 46a when the transistor nMOS 103 is in on state.

The trench isolation structure 68b of the test structure 53a and the in-line portions 80a of the trench isolation structure 8a are formed under the same conditions and so on, and the distance d1 is controlled to be the same as the distance d1 of the in-line portions 80a. When the leakage current 54 in the test structure 53a falls within the specified range ref, it is thus indirectly judged that the leakage current 46a of the nMOS transistor 103 is also in the specified range ref. As a result, the semiconductor device might be regarded as a non-defective product.

However, despite the existence of some problem in the manufacturing process of the in-line portions 80a, the leakage current 46a may accidentally be in the specified range ref. In view of this, when the leakage current 54 measured in the test structure 53a is in the specified range ref, it is compared with the leakage current 54 in the test structure 53b or in the test structure 53c.

The distance d1 is greater in the test structure 53b than in the test structure 53a, and hence, the leakage current 54 is greater in the test structure 53b than in the test structure 53a from a design viewpoint. The distance d1 is smaller in the test structure 53c than in the test structure 53a, and hence, the leakage current 54 is smaller in the test structure 53c than in the test structure 53a from a design viewpoint.

The respective trench isolation structures 68b of the test structures 53b and 53c and the in-line portions 80a of the trench isolation structure 8a are formed under the same conditions and so on. When the actually measured value of the leakage current 54 makes substantially no change between the test structures 53a and 53b, or between the test structures 53a and 53c, for example, it is judged accordingly that the manufacturing process of the in-line portions 80a experiences some problem. Based on this result, the manufacturing conditions and the like of the in-line portions 80a are reset.

When the leakage current 54 of the test structure 53a falls outside the specified range ref, it is judged that the leakage current 46a of the nMOS transistor 103 is also outside the specified range ref. As a result, the semiconductor device is regarded as a defective product. However, the leakage current 54 cannot be operative to determine which part is defective in the in-line portions 80a.

In view of this, when the leakage current 54 measured in the test structure 53a is outside the specified range ref, comparison of the leakage current 54 is also made between the test structures 53a and 53b, or between the test structures 53a and 53c.

As an example, under circumstances where the leakage current 54 of the test structure 53a is smaller than the lower limit of the specified range ref, where the actually measured value of the leakage current 54 is greater in the test structure 53b than in the test structure 53a, and where the actually measured value of the leakage current 54 is substantially the same in the test structures 53c and 53a, it is assumed that there is no opening between the insulating films 8ab of the in-line portions 80a. Absence of such an opening which should essentially be formed leads to the determination that the manufacturing process of the in-line portions 80a has some problem. Based on this result, the manufacturing conditions and the like of the in-line portions 80a are reset.

Even when direct measurement of the leakage current 46a as part of the MOS current 46 is of some difficulty, the manufacturing process of the in-line portions 80a of the trench isolation structure 8a can be evaluated by means of the plurality of test structures 53 as a monitor which have their respective values of the distance d1.

Sixth Preferred Embodiment

Figure 26:
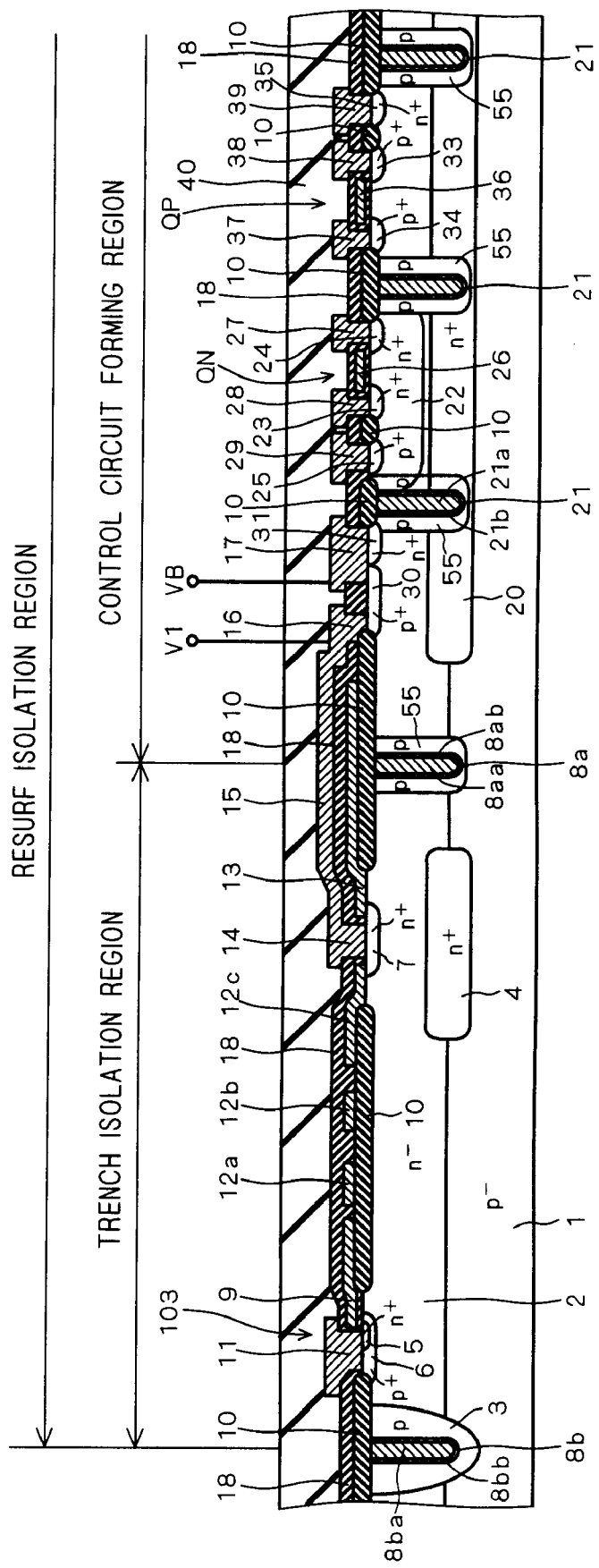
FIG. 26 is a sectional view of the structure of a semiconductor device according to a sixth preferred embodiment of the present invention.
Figure 27:
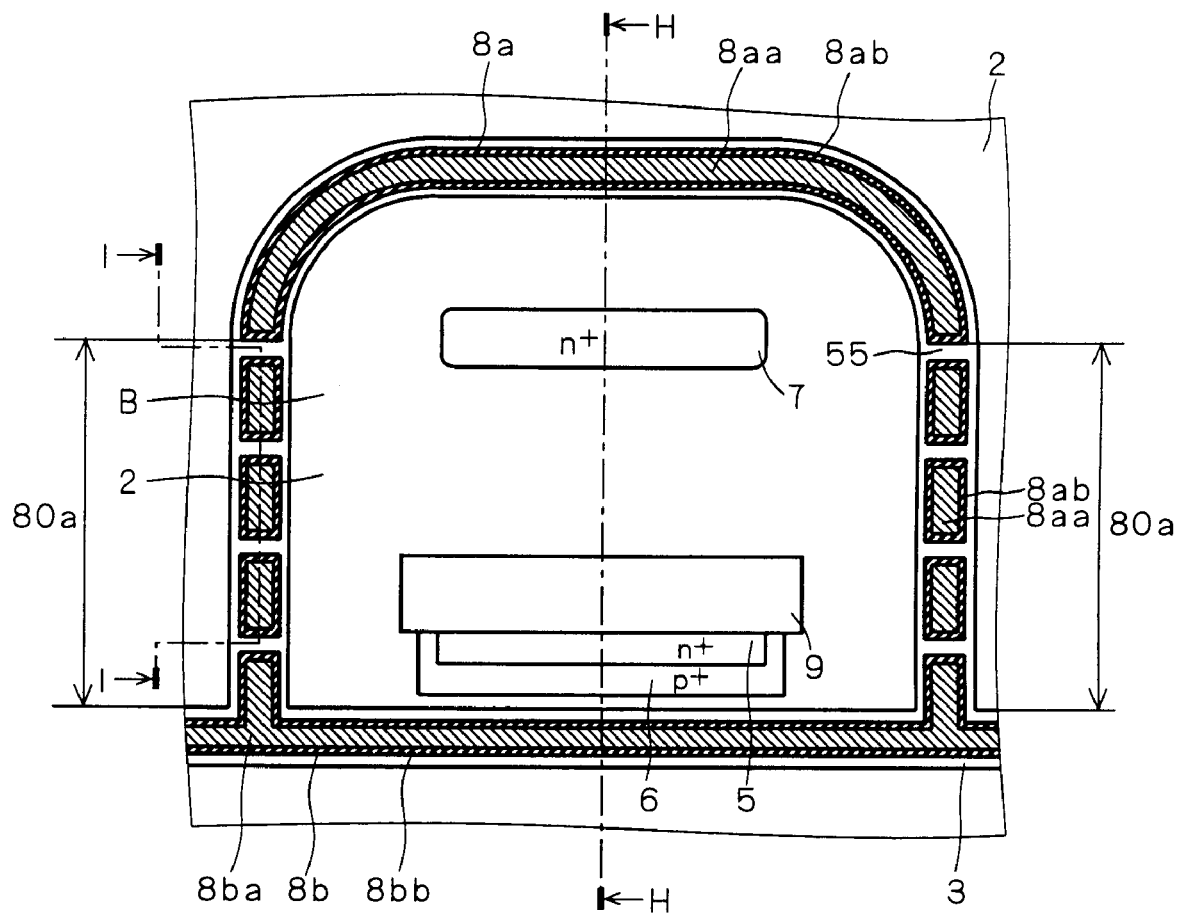
FIG. 27 is a plan view of the structure of the semiconductor device according to the sixth preferred embodiment.
Figure 28:
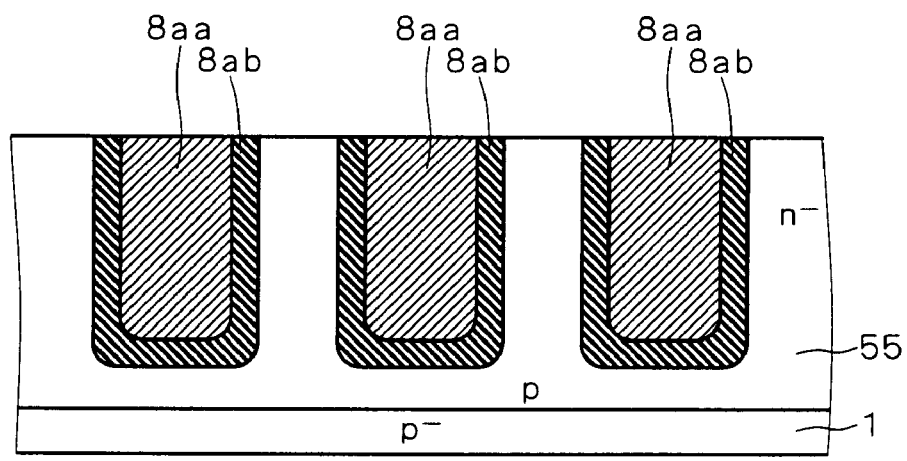
FIG. 28 is a sectional view of the structure of the semiconductor device according to the sixth referred embodiment.

FIGS. 26 and 27 are a sectional view and a plan view, respectively, of the structure of a semiconductor device according to a sixth preferred embodiment of the present invention. FIG. 28 is a sectional view taken along an arrowed line I-I of FIG. 27. The cross section of FIG. 26 is taken along a line corresponding to the arrowed line D-D of FIG. 2. Except for the gate electrode 9, the structure over the n⁻ semiconductor layer 2 (including the isolation insulating film 10) is omitted from FIG. 27. The left half of the sectional view of FIG. 26 is taken along an arrowed line H-H of FIG. 27.

The semiconductor device of the sixth preferred embodiment incorporates a p impurity region 55 into the semiconductor device of the third preferred embodiment.

With reference to FIGS. 26 through 28, the p impurity region 55 is provided in the upper surface of the n⁻ semiconductor layer 2 defined in the RESURF isolation region, extending along the perimeter of the trench isolation region B. The insulating films 8ab of the trench isolation structure 8a are covered with the p impurity region 55 connected to the p impurity region 3, at the surfaces except those exposed from the upper surface of the n⁻ semiconductor layer 2.

In the in-line portions 80a of the trench isolation structure 8a, the p impurity region 55 surrounds each one of the plurality of insulating films 8ab, and fills the openings between adjacent insulating films 8ab.

In the semiconductor device of the sixth preferred embodiment, the insulating film 21b of each trench isolation structure 21 is also surrounded by the p impurity region, at the surface except that exposed from the upper surface of the n⁻ semiconductor layer 2.

The semiconductor device of the sixth preferred embodiment requires the p impurity region 55 to fill the openings between the insulating films 8ab of the in-line portions 80a as discussed, to thereby reduce the leakage current 46a to a greater degree as compared with the semiconductor device of the third preferred embodiment.

Figure 29:
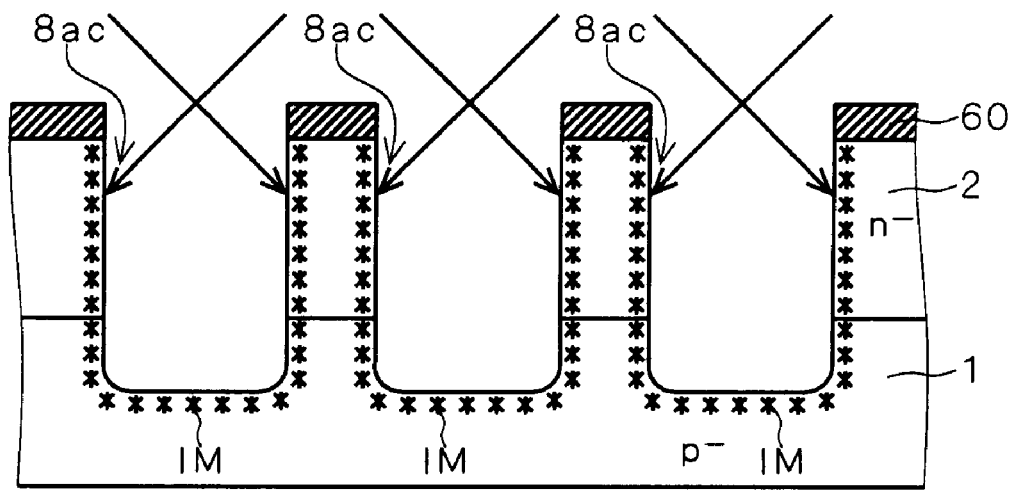
FIGS. 29 and 30 are sectional views showing a method of manufacturing the semiconductor device according to the sixth preferred embodiment.
Figure 30:
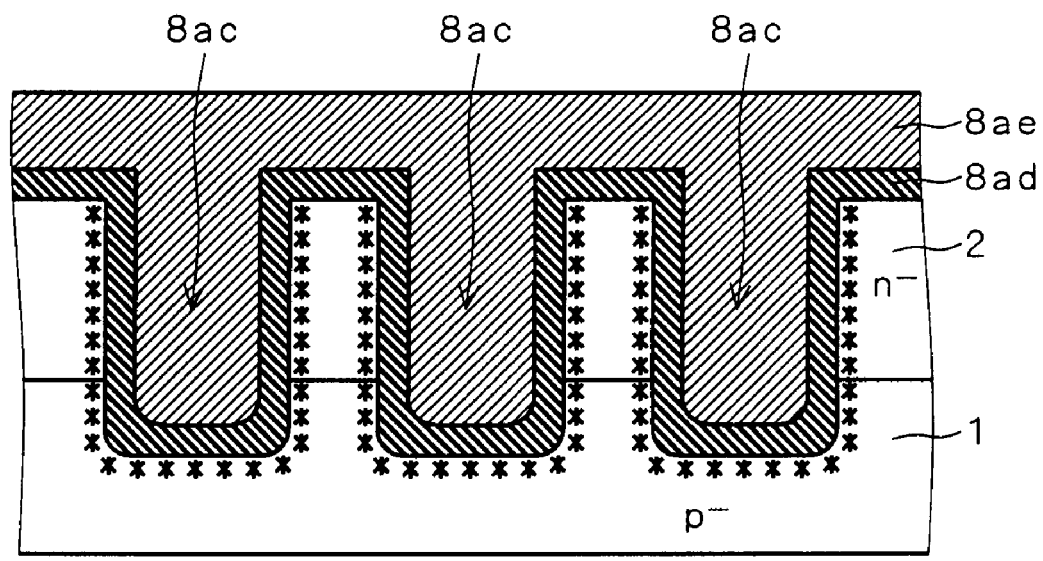

Next, it will be discussed how the p impurity region 55 is formed. FIGS. 29 and 30 are sectional views showing a method of forming the p impurity region 55, taken along the arrowed line I-I of FIG. 27.

With reference to FIG. 29, the n⁻ semiconductor layer 2 is provided first on the p⁻ semiconductor substrate 1. Thereafter, the plurality of trenches 8ac are formed in the n⁻ semiconductor layer 2, extending from the upper surface of the n⁻ semiconductor layer 2 to reach the interface with the p⁻ semiconductor substrate 1. The plurality of trenches 8ac are separated by a certain distance. A resist 60 is subsequently formed on the upper surface of the n⁻ semiconductor layer 2.

Next, the respective inner walls of the trenches 8ac are subjected to ion implantation with p-type impurities IM, in slanting directions relative to the direction vertical to the upper surface of the n⁻ semiconductor layer 2. The resist 60 is thereafter removed.

Next, with reference to FIG. 30, the respective inner walls of the trenches 8ac and the upper surface of the n⁻ semiconductor layer 2 are oxidized to deposit the insulating film material 8ad on the respective inner surfaces of the trenches 8ac and the upper surface of the n⁻ semiconductor layer 2. Subsequently, the conductive material 8ae is deposited on the insulating film material 8ad to fill the trenches 8ac.

Next, the insulating film material 8ad and the conductive material 8ae existing above the trenches 8ac are removed, followed by high temperature processing, to thereby concurrently form the insulating films 8ab on the inner surfaces of the trenches 8ac and the conductive films 8aa filling the trenches 8ac. Further, the impurities IM are diffused to form the p impurity region 55, to reach the structure shown in FIG. 28.

As discussed, formation of the in-line portions 80a of the trench isolation structure 8a involves formation of the p impurity region 55, thereby leading to a shorter period for manufacturing a semiconductor device as compared with the process which requires a step of forming the p impurity region 55 and a step of forming the in-line portions 80a thereafter.

When the potential VB and the ground potential GND are respectively applied to the electrode 17 and the p⁻ semiconductor substrate 1, the PN junction between the p impurity region 55 and the n⁻ semiconductor layer 2 is subjected to application of a reverse voltage. In this case, the p impurity region 55 is desirably depleted in its entirety. This is because, when the p impurity region 55 is not depleted in its entirety, drop in breakdown voltage may occur as a result of electric field concentration in the p impurity region 55.

The conditions for bringing the p impurity region 55 in its entirety into a depleted state will be given below.

As discussed, formation of the p impurity region 55 requires ion implantation of the impurities IM into the respective inner walls of the trenches 8ac, and thermal diffusion of the impurities IM thereafter. A diffusion depth dm, which is a depth in the p impurity region 55 in a direction vertical to the inner surfaces of the trenches 8ac, and an average value N of the impurity concentration of the p impurity region 55, are controlled to satisfy following expression (1):

$$N[\text{cm}^{-3}] \times dm[\text{cm}] \approx 1.0 \times 10^{-12} \, [\text{cm}^{-2}] \tag{1}$$

The diffusion depth dm and the average value N satisfying expression (1) bring the p impurity region 55 into a depleted state, except for the portions that fill the openings between the insulating films 8ab of the in-line portions 80a. Expression (1) is introduced as RESURF conditions in U.S. Pat. No. 4,292,642, and in "THIN LAYER HIGH-VOLTAGE DEVICES (RESURF DEVICES)", pp. 1-13, J. A. Appels et al., Philips Journal of Research, vol. 35. No. 1, 1980.

Further, a width W, which is a width of the trenches 8ac in a direction vertical to the extending direction of the trench isolation structure 8a, and the diffusion depth dm and the average value N of the impurity concentration are controlled to satisfy following expressions (2) and (3):

$$N[\text{cm}^{-3}] \times W[\text{cm}] \approx 2.0 \times 10^{-12} [\text{cm}^{-2}] \tag{2}$$

$$W \leq 2 \times dm \tag{3}$$

The width W, the diffusion depth dm, and the average value N satisfying expressions (2) and (3) bring the p impurity region 55 into a depleted state at the portion that fills the opening between the insulating films 8ab of the in-line portions 80a. When the distance D between adjacent trenches 8ac is controlled to be smaller than the value which is twice the diffusion depth dm, the portions of the p impurity region 55 are connected on the inner walls of one trench 8ac and of the other trench 8ac adjacent thereto.

Seventh Preferred Embodiment

Figure 31:
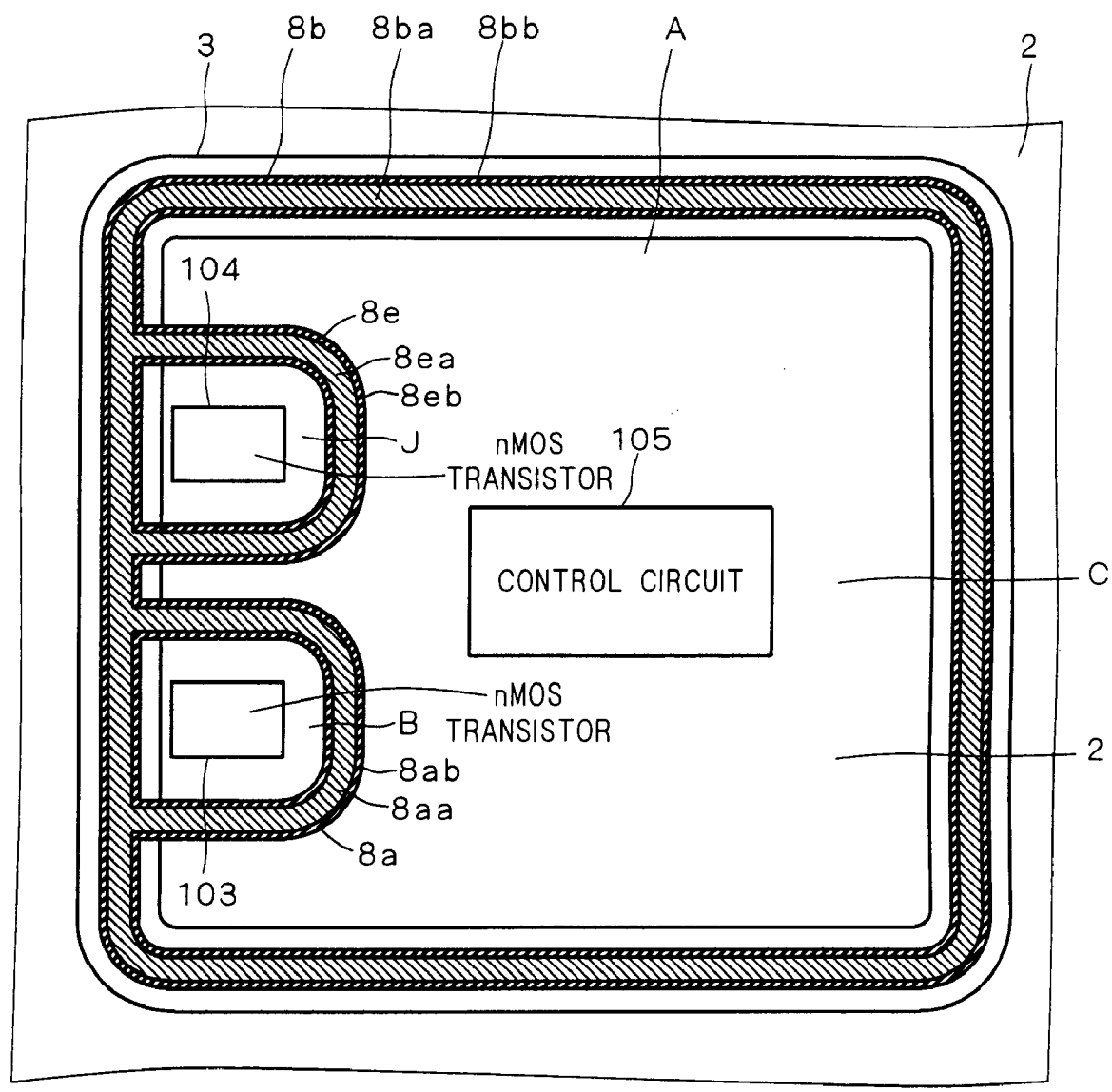
FIGS. 31 and 32 are plan views of the structure of a semiconductor device according to a seventh preferred embodiment of the present invention.
Figure 32:
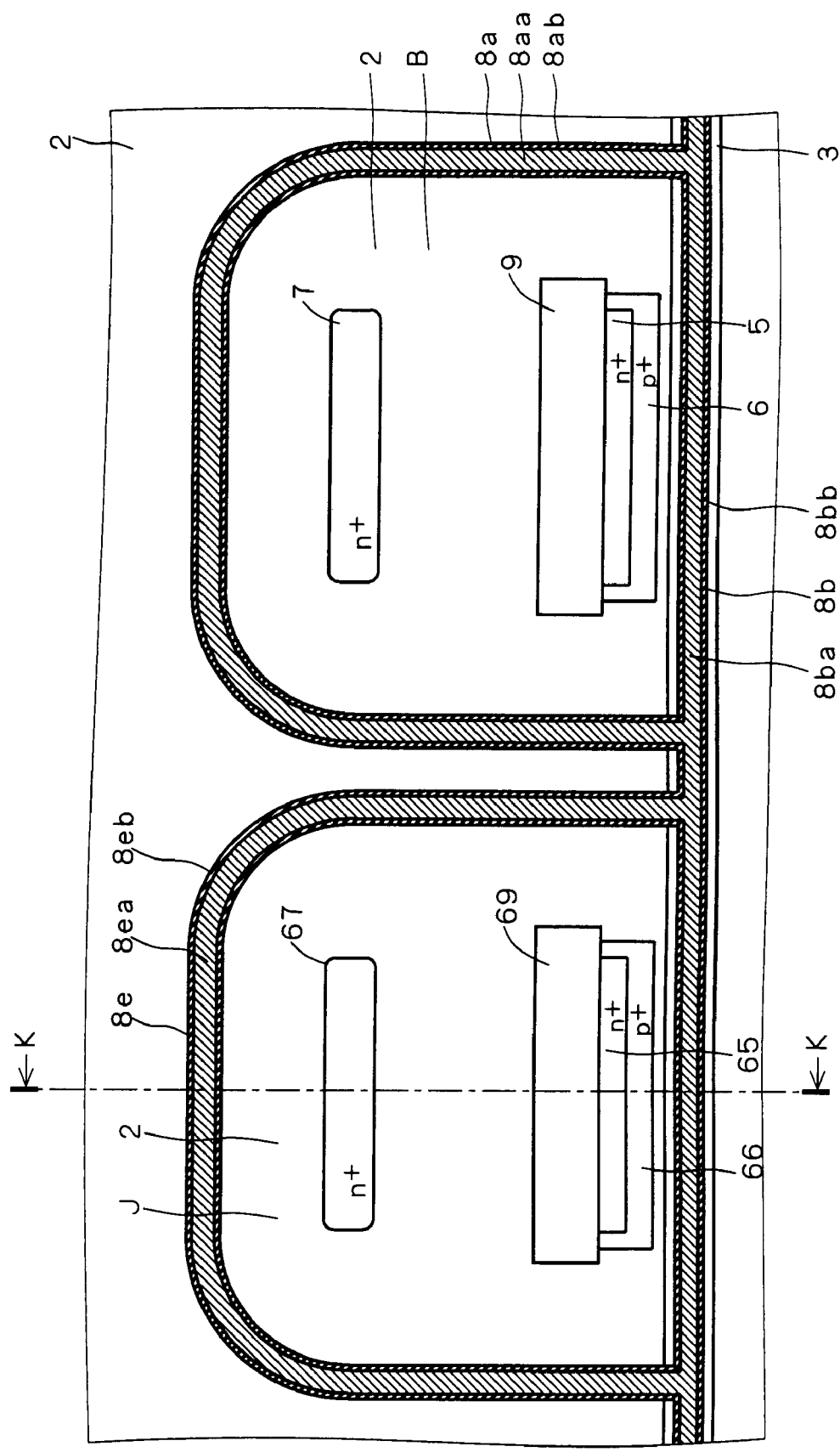
Figure 33:
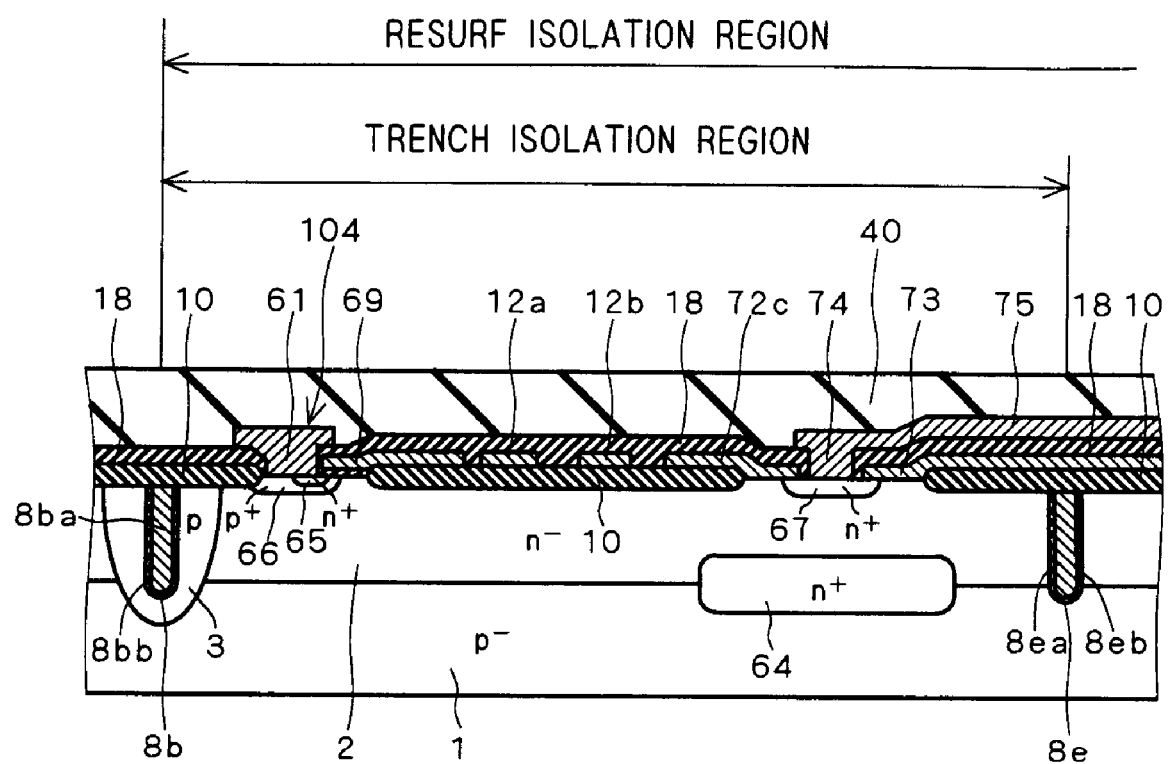
FIG. 33 is a sectional view of the structure of the semiconductor device according to the seventh preferred embodiment.

FIG. 31 is a plan view of the structure of a semiconductor device according to a seventh preferred embodiment of the present invention. FIG. 32 is an enlarged plan view of trench isolation regions B and J and their peripheries shown in FIG. 31. FIG. 33 is a sectional view taken along an arrowed line K-K of FIG. 32. For the convenience of description, the structure over the n⁻ semiconductor layer 2 of FIG. 33 (including the isolation insulating film 10) is omitted from FIG. 31. Except for gate electrodes 9 and 69, the structure over the n⁻ semiconductor layer 2 (including the isolation insulating film 10) is also omitted from FIG. 32.

The semiconductor device of the seventh preferred embodiment substantially differs from the semiconductor device of the first preferred embodiment in that a trench isolation structure 8e is further provided to form the nMOS transistor 104 in the RESURF isolation region A.

As shown in FIGS. 31, 32 and 33, the trench isolation structure 8e is provided in the n⁻ semiconductor layer 2 defined in the RESURF isolation region A, extending from the upper surface of the n⁻ semiconductor layer 2 to reach the interface with the p⁻ semiconductor substrate 1. The trench isolation structure 8e is connected to the p impurity region 3. The trench isolation structure 8e and the p impurity region 3 together surround a part of the n⁻ semiconductor layer 2 in the RESURF isolation region A, whereby a trench isolation region J which includes therein the nMOS transistor 104 is defined in the n⁻ semiconductor layer 2 in the RESURF isolation region A.

The trench isolation structure 8e includes a conductive film 8ea and an insulating film 8eb, and is coupled to the trench isolation structure 8b. The conductive film 8ea, which may be a polysilicon film, for example, is coupled to the conductive film 8ba of the trench isolation structure 8b. The conductive film 8ea is provided in the n⁻ semiconductor layer 2, extending from the upper surface of the n⁻ semiconductor layer 2 to reach the interface with the p⁻ semiconductor substrate 1.

The conductive film 8ea is covered with the insulating film 8eb, at the surface buried in the n⁻ semiconductor layer 2 and the p⁻ semiconductor substrate 1. The insulating film 8eb may be a silicon oxide film, for example, and is coupled to the insulating film 8bb of the trench isolation structure 8b.

In the trench isolation region J, an n⁺ impurity region 67 is provided in the upper surface of the n⁻ semiconductor layer 2. The n⁻ semiconductor layer 2 further includes in its upper surface a p⁺ impurity region 66, to be held between the n⁺ impurity region 67 and the p impurity region 3. The p⁺ impurity region 66 includes in its upper surface an n⁺ impurity region as a source region 65 of the nMOS transistor 104. The n⁻ semiconductor layer 2 defined between the p⁺ impurity region 66 and the n⁺ impurity region 67, and the n⁺ impurity region 67 are together operative to function as a drain region of the nMOS transistor 104. An n⁺ buried impurity region 64 is selectively provided under the n$^+$ impurity region 67, and at the interface between the n$^-$ semiconductor layer 2 and the p$^-$ semiconductor substrate 1.

The gate electrode 69 of the nMOS transistor 104, and field plates 12a, 12b and 72c are provided over the n$^-$ semiconductor layer 2 defined between the p$^+$ impurity region 66 and the n$^+$ impurity region 67, while holding the isolation insulating film 10 with the n$^-$ semiconductor layer 2. The gate electrode 69 and the field plates 12a, 12b and 72c are arranged in this order in a direction from the p$^+$ impurity region 66 towards the n$^+$ impurity region 67.

The gate electrode 69 covers an end portion of the p$^+$ impurity region 66 with no contact therebetween, and is subjected to application of a gate potential. The field plate 72c contacts an end portion of the n$^+$ impurity region 67. The field plates 12a and 12b are interposed between the gate electrode 69 and the field plate 72c to respectively form capacitive coupling with the gate electrode 69 and the field plate 72c, whereby an electric field generated by the potential difference between the source and the drain of the nMOS transistor 104 is relaxed at the upper surface of the n$^-$ semiconductor layer 2.

A field plate 73 is provided over the trench isolation structure 8e, with the isolation insulating film 10 therebetween. The field plate 73 contacts an end portion of the n$^+$ impurity region 67. The gate electrode 69 and the field plates 72c and 73 include polysilicon, for example. The trench isolation structure 8e has an upper surface covered with the isolation insulating film 10.

The insulating film 18 also covers the gate electrode 69 and the field plates 72c and 73. A source electrode 61 of the nMOS transistor 104 which contacts the p$^+$ impurity region 66 and the source region 65, and a drain electrode 74 of the nMOS transistor 104 which contacts the n$^+$ impurity region 67, both penetrate the insulating film 18.

In the control circuit forming region C, a p$^+$ impurity region (not shown) operative to function as the resistor 107 is provided in the upper surface of the n$^-$ semiconductor layer 2. This p$^+$ impurity region and the drain electrode 74 are connected to each other through an interconnect line 75, which may be an aluminum line provided over the field plate 73.

As an example, the source electrode 61 and the drain electrode 74 are aluminum electrodes. For simplification of FIG. 33, a gate insulating film of the nMOS transistor 104 is shown as a part of the insulating film 18. The insulating film 40 also covers the source electrode 61 and the drain electrode 41.

In the seventh preferred embodiment, the I/F circuit 101 and the pulse generation circuit 102 not shown are arranged in the n$^-$ semiconductor layer 2 excluding the RESURF isolation region A. The other constituent elements are the same as those of the semiconductor device 100 of the first preferred embodiment, and hence, the description thereof will be omitted.

When the n$^-$ semiconductor layer 2 and the p$^-$ semiconductor substrate 1 in the control circuit forming region C are respectively subjected to application of the potential VB and the ground potential GND, a depletion layer is formed in the trench isolation region J as in the trench isolation region B, extending in the n$^-$ semiconductor layer 2 in its entirety from the p impurity region 3 towards the n$^+$ buried impurity region 64. As a result, the nMOS transistor 104 is allowed to have an improved breakdown voltage.

As discussed, the semiconductor device of the seventh preferred embodiment comprises both the nMOS transistors 103 and 104 in the RESURF isolation region A, thereby realizing higher degree of shrinkage than the semiconductor device 100 of the first preferred embodiment.

The trench isolation structure 8e is formed by the same method as employed for the trench isolation structure 8a. For the same reason given with reference to the trench isolation structure 8a, the trench isolation structure 8e is also not necessarily required to reach the p$^-$ semiconductor substrate 1. The trench isolation structure 8e is required to extend at least to the vicinity of the interface between the n$^-$ semiconductor layer 2 and the p$^-$ semiconductor substrate 1.

Eighth Preferred Embodiment

Figure 34:
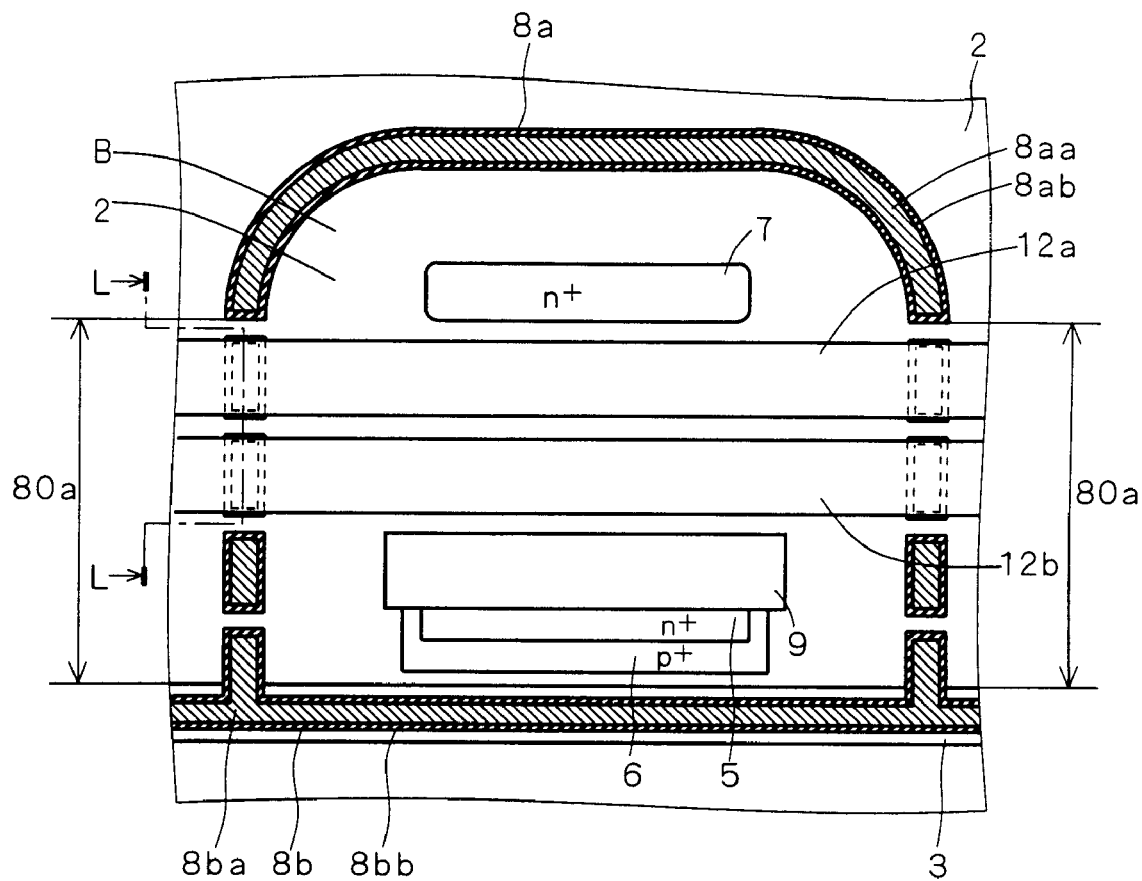
FIG. 34 is a plan view of the structure of a semiconductor device according to an eighth preferred embodiment of the present invention.
Figure 35:
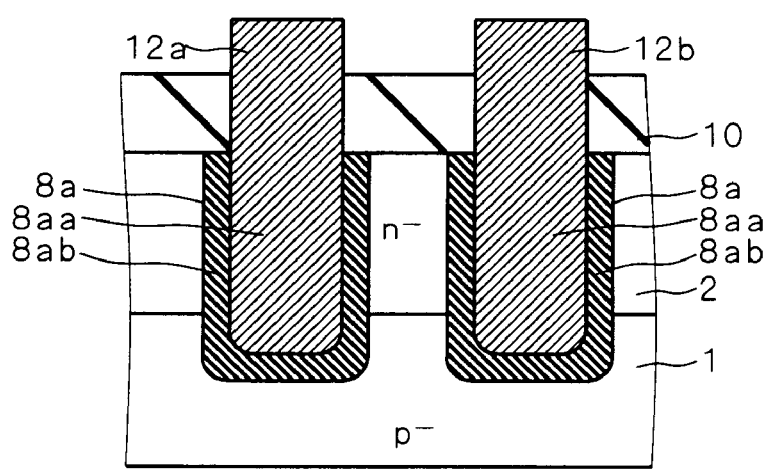
FIG. 35 is a sectional view of the structure of the semiconductor device according to the eighth preferred embodiment.

FIG. 34 is a plan view of the structure of a semiconductor device according to an eighth preferred embodiment of the present invention. The cross section of FIG. 35 is taken along an arrowed line L-L of FIG. 34 which is an enlarged plan view of the trench isolation region B and its periphery. Except for the gate electrode 9 and the filed plates 12a and 12b, the structure over the n$^-$ semiconductor layer 2 (including the isolation insulating film 10) is omitted from FIG. 34. The insulating films 18 and 40 are also omitted from FIG. 35.

The field plates 12a and 12b are floating electrodes insulated from their surroundings in the semiconductor device of the third preferred embodiment, whereas in the semiconductor device of the eighth preferred embodiment, the field plates 12a and 12b are both connected to the conductive films 8aa at the in-line portions 80a of the trench isolation structure 8a.

With reference to FIGS. 34 and 35, the conductive films 8aa at the in-line portions 80a are each exposed from the upper surface of the n$^-$ semiconductor layer 2, with no isolation insulating film 10 thereon. The field plate 12a, formed over the n$^-$ semiconductor layer 2 between the p impurity region 3 and the n$^+$ buried impurity region 4 while holding the isolation insulating film 10 with the n$^-$ semiconductor layer 2, is connected to the conductive films 8aa at the in-line portions 80a. Likewise, the field plate 12b is formed in the n$^-$ semiconductor layer 2 between the p impurity region 3 and the n$^+$ buried impurity region 4 while holding the isolation insulating film 10 with the n$^-$ semiconductor layer 2, and is connected to the conductive films 8aa at the in-line portions 80a other than those connected to the field plate 12a.

While being placed in a floating state insulated from their surroundings, the conductive films 8aa are capacitively coupled to a depletion layer extending from the p impurity region 3 subjected to application of the ground potential GND. That is, the conductive films 8aa gradually increase in potential as the conductive films 8aa go farther from the p impurity region 3. The potentials of the conductive films 8aa are strongly influenced by the potential of the n$^-$ semiconductor layer 2, and hence are unlikely to vary and kept substantially constant.

A molding resin (not shown) is provided to cover the insulating film 40. Polarization charges in this molding resin may inhibit extension of the depletion layer in the n$^-$ semiconductor layer 2.

In the semiconductor device of the eighth preferred embodiment, the field plates 12a and 12b are connected to the conductive films 8aa at the in-line portions 80a of the trench isolation structure 8a. The field plates 12a and 12b are allowed accordingly to bear stable potentials, to thereby stabilize in potential the vicinity of the upper surface of the n$^-$ semiconductor layer 2 defined under the field plates 12a and 12b. As a result, the polarization charges in the molding resin covering the insulating film 40 are less influential, to thereby prevent drop in breakdown voltage.

Next, it will be discussed how the field plates 12a and 12b are formed with reference to the sectional views of FIGS. 36 through 40 taken along the arrowed line L-L of FIG. 34.

Figure 36:
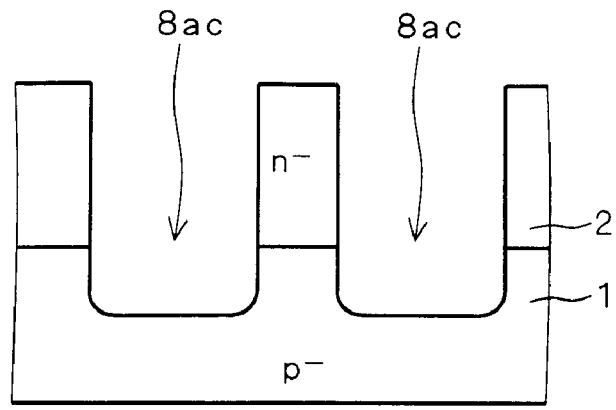
FIGS. 36 through 40 are sectional showing a method of manufacturing the semiconductor device according to the eighth preferred embodiment.

With reference to FIG. 36, the n⁻ semiconductor layer 2 is provided on the p⁻ semiconductor substrate 1. The plurality of trenches 8ac are thereafter formed in the n⁻ semiconductor layer 2 and the p⁻ semiconductor substrate 1, to be separated by a certain distance.

Figure 37:
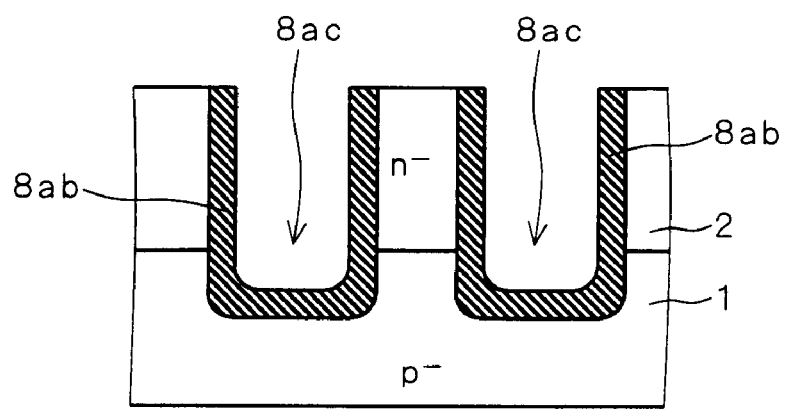
Figure 38:
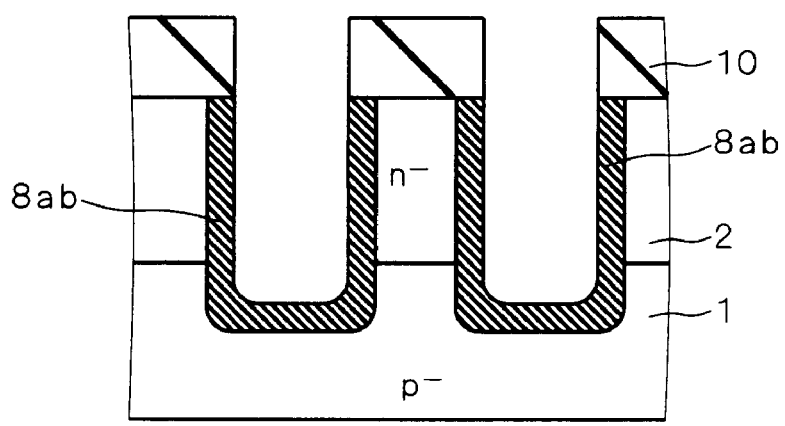

With reference to FIG. 37, the respective inner walls of the trenches 8ac are oxidized next to form the insulating films 8ab on the respective inner surfaces of the trenches 8ac. The isolation insulating film 10 is then provided on the upper surface of the n⁻ semiconductor layer 2 as shown in FIG. 38.

Figure 39:
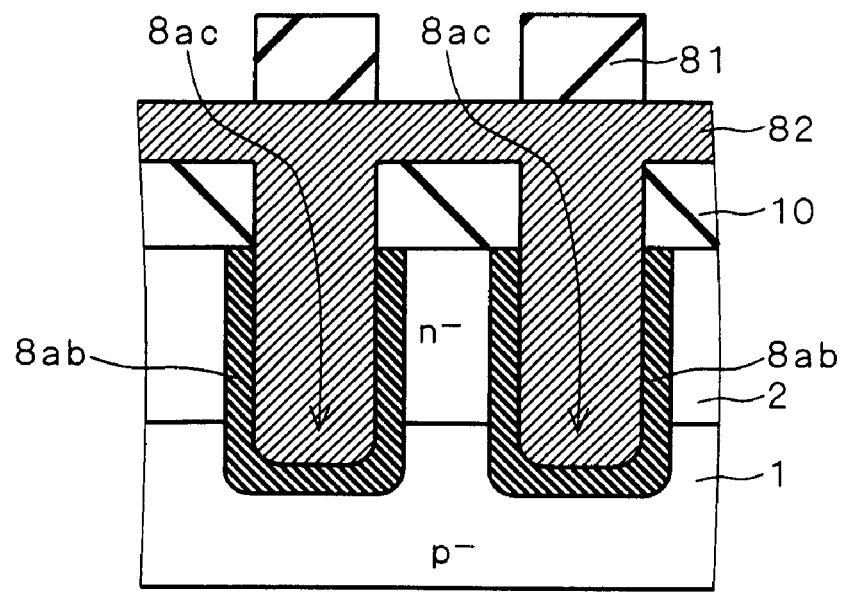

With reference to FIG. 39, a conductive material which may be polysilicon, for example, is subsequently deposited to fill the trenches 8ac, followed by formation of a resist 81 having a predetermined opening pattern on the conductive material 82.

Figure 40:
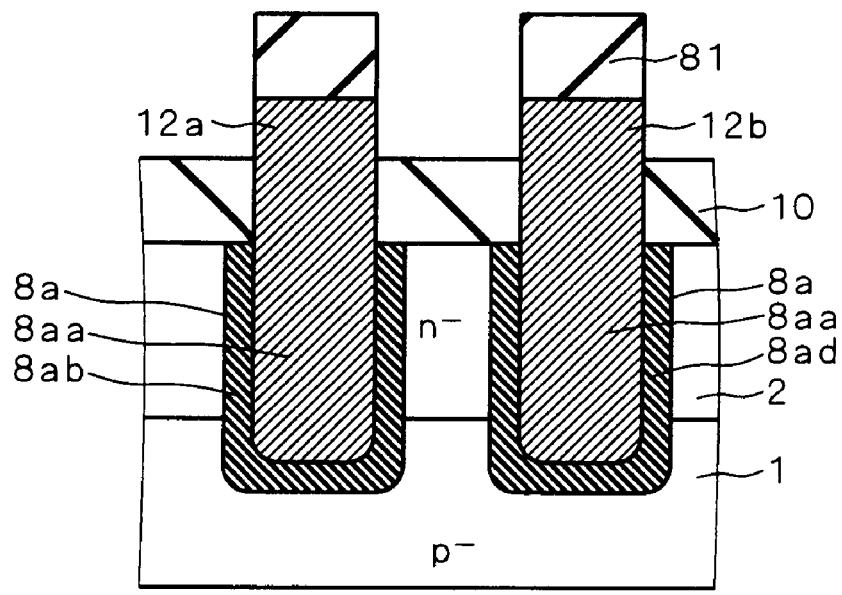

The conductive material 82 is thereafter patterned using the resist 81 as a mask, to concurrently form the conductive films 8aa at the in-line portions 80a and the field plates 12a and 12b as shown in FIG. 40.

As discussed, formation of the field plates 12a and 12b and formation of the conductive films 8aa of the in-line portions 80a coincide with each other in the eighth preferred embodiment, thereby leading to a shorter period for manufacturing a semiconductor device as compared with the process which requires respective steps of forming the field plates 12a and 12b, and forming the conductive films 8aa of the in-line portions 80a.

While the invention has been shown and described in detail, the foregoing description is in all aspects illustrative and not restrictive. It is therefore understood that numerous modifications and variations can be devised without departing from the scope of the invention.

What is claimed is:

1. A method of manufacturing a semiconductor device, said semiconductor device comprising:
    a semiconductor substrate of a first conductivity type;
    a semiconductor layer of a second conductivity type provided on said semiconductor substrate;
    a first impurity region of said first conductivity type provided in said semiconductor layer, extending from an upper surface of said semiconductor layer to reach an interface with said semiconductor substrate, said first impurity region defining a RESURF isolation region;
    a trench isolation structure provided in said semiconductor layer defined in said RESURF isolation region to be connected to said first impurity region, extending from said upper surface of said semiconductor layer to reach at least the vicinity of said interface with said semiconductor substrate, said trench isolation structure and said first impurity region together defining a trench isolation region in said RESURF isolation region;
    a semiconductor element provided in said semiconductor layer defined in said RESURF isolation region excluding said trench isolation region;
    a MOS transistor, comprising
    a second impurity region of said second conductivity type provided in said upper surface of said semiconductor layer defined in said trench isolation region, said second impurity region being connected to a drain electrode of said MOS transistor,
    a third impurity region of said first conductivity type provided in said upper surface of said semiconductor layer defined between said first and second impurity regions, and
    a source region of said second conductivity type provided in an upper surface of said third impurity region; and
    a buried impurity region of said second conductivity type provided under said second impurity region and at said interface between said semiconductor layer and said semiconductor substrate, said buried impurity region being higher in impurity concentration than said semiconductor layer,
    wherein said trench isolation structure comprises an in-line portion which extends from said first impurity region towards said second impurity region, said in-line portion including
    a plurality of spaced-apart conductive films provided in said semiconductor layer defined in said RESURF isolation region, aligning in the extending direction of said in-line portion, and
    a plurality of insulating films for covering respective ones of said plurality of conductive films, at surfaces buried in said semiconductor layer,
    said method comprising the steps of:
    (a) providing said semiconductor layer on said semiconductor substrate;
    (b) forming a plurality of trenches in said semiconductor layer to be separated by a certain distance, said plurality of trenches extending from said upper surface of said semiconductor layer to reach at least the vicinity of said interface with said semiconductor substrate;
    (c) oxidizing respective inner walls of said plurality of trenches to provide said plurality of insulating films on respective inner surfaces of said plurality of trenches; and
    (d) providing said plurality of conductive films to respectively fill said plurality of trenches,
    wherein in said step (a), a distance between adjacent ones of said plurality of trenches is not more than a thickness of said plurality of insulating films.

2. A method of manufacturing a semiconductor device, said semiconductor device comprising:
    a semiconductor substrate of a first conductivity type;
    a semiconductor layer of a second conductivity type provided on said semiconductor substrate;
    a first impurity region of said first conductivity type provided in said semiconductor layer, extending from an upper surface of said semiconductor layer to reach an interface with said semiconductor substrate, said first impurity region defining a RESURF isolation region;
    a trench isolation structure provided in said semiconductor layer defined in said RESURF isolation region to be connected to said first impurity region, extending from said upper surface of said semiconductor layer to reach at least the vicinity of said interface with said semiconductor substrate, said trench isolation structure and said first impurity region together defining a trench isolation region in said RESURF isolation region;
    a semiconductor element provided in said semiconductor layer defined in said RESURF isolation region excluding said trench isolation region;
    a MOS transistor, comprising
    a second impurity region of said second conductivity type provided in said upper surface of said semiconductor layer defined in said trench isolation region, said second impurity region being connected to a drain electrode of said MOS transistor,
    a third impurity region of said first conductivity type provided in said upper surface of said semiconductor layer defined between said first and second impurity regions, and
    a source region of said second conductivity type provided in an upper surface of said third impurity region; and a buried impurity region of said second conductivity type provided under said second impurity region and at said interface between said semiconductor layer and said semiconductor substrate, said buried impurity region being higher in impurity concentration than said semiconductor layer, wherein said trench isolation structure comprises an in-line portion which extends from said first impurity region towards said second impurity region, said in-line portion including a plurality of spaced-apart conductive films provided in said semiconductor layer defined in said RESURF isolation region, aligning in the extending direction of said in-line portion, and a plurality of spaced-apart insulating films for covering respective ones of said plurality of conductive films, at surfaces buried in said semiconductor layer, and wherein said semiconductor device further comprises a fourth impurity region provided in said upper surface of said semiconductor layer defined in said RESURF isolation region, surrounding each one of said plurality of insulating films while filling openings between adjacent ones of said plurality of insulating films, said method comprising the steps of:

(a) providing said semiconductor layer on said semiconductor substrate;

(b) forming a plurality of trenches in said semiconductor layer to be separated by a certain distance, said plurality of trenches extending from said upper surface of said semiconductor layer to reach at least the vicinity of said interface with said semiconductor substrate;

(c) introducing impurities of said first conductivity type into respective inner walls of said plurality of trenches to provide said fourth impurity region;

(d) providing said plurality of insulating films on respective inner surfaces of said plurality of trenches; and (e) providing said plurality of conductive films to respectively fill said plurality of trenches.

3. A method of manufacturing a semiconductor device, said semiconductor device comprising:

a semiconductor substrate of a first conductivity type;

a semiconductor layer of a second conductivity type provided on said semiconductor substrate;

a first impurity region of said first conductivity type provided in said semiconductor layer, extending from an upper surface of said semiconductor layer to reach an interface with said semiconductor substrate, said first impurity region defining a RESURF isolation region;

a trench isolation structure provided in said semiconductor layer defined in said RESURF isolation region to be connected to said first impurity region, extending from said upper surface of said semiconductor layer to reach at least the vicinity of said interface with said semiconductor substrate, said trench isolation structure and said first impurity region together defining a trench isolation region in said RESURF isolation region;

a semiconductor element provided in said semiconductor layer defined in said RESURF isolation region excluding said trench isolation region;

a MOS transistor, comprising a second impurity region of said second conductivity type provided in said upper surface of said semiconductor layer defined in said trench isolation region, said second impurity region being connected to a drain electrode of said MOS transistor, a third impurity region of said first conductivity type provided in said upper surface of said semiconductor layer defined between said first and second impurity regions, and a source region of said second conductivity type provided in an upper surface of said third impurity region; and a buried impurity region of said second conductivity type provided under said second impurity region and at said interface between said semiconductor layer and said semiconductor substrate, said buried impurity region being higher in impurity concentration than said semiconductor layer, wherein said trench isolation structure comprises an in-line portion which extends from said first impurity region towards said second impurity region, said in-line portion including a plurality of spaced-apart conductive films provided in said semiconductor layer defined in said RESURF isolation region, aligning in the extending direction of said in-line portion, and a plurality of first insulating films for covering respective ones of said plurality of conductive films, at surfaces buried in said semiconductor layer, wherein said semiconductor device further comprises a second insulating film provided on said semiconductor layer defined between said first impurity region and said buried impurity region, and a plurality of field plates provided on said second insulating film, wherein said plurality of conductive films are exposed from said upper surface of said semiconductor layer, and wherein said plurality of field plates are respectively connected to said plurality of conductive films, said method comprising the steps of:

(a) providing said semiconductor layer on said semiconductor substrate;

(b) forming a plurality of trenches in said semiconductor layer to be separated by a certain distance, said plurality of trenches extending from said upper surface of said semiconductor layer to reach at least the vicinity of said interface with said semiconductor substrate;

(c) providing said plurality of first insulating films on respective inner surfaces of said plurality of trenches;

(d) providing said second insulating film on said semiconductor layer;

(e) depositing a conductive material on said second insulating film to fill said plurality of trenches; and (f) patterning said conductive material to concurrently provide said plurality of conductive films and said plurality of field plates.

4. A method of evaluating manufacturing process of a semiconductor device, said semiconductor device comprising:

a semiconductor substrate of a first conductivity type;

a semiconductor layer of a second conductivity type provided on said semiconductor substrate;

a first impurity region of said first conductivity type provided in said semiconductor layer, extending from an upper surface of said semiconductor layer to reach an interface with said semiconductor substrate, said first impurity region defining a RESURF isolation region;

a first trench isolation structure provided in said semiconductor layer defined in said RESURF isolation region to be connected to said first impurity region, extending from said upper surface of said semiconductor layer to reach at least the vicinity of said interface with said semiconductor substrate, said first trench isolation structure and said first impurity region together defining a trench isolation region in said RESURF isolation region;

a semiconductor element provided in said semiconductor layer defined in said RESURF isolation region excluding said trench isolation region;

a MOS transistor, comprising a second impurity region of said second conductivity type provided in said upper surface of said semiconductor layer defined in said trench isolation region, said second impurity region being connected to a drain electrode of said MOS transistor, a third impurity region of said first conductivity type provided in said upper surface of said semiconductor layer defined between said first and second impurity regions, and a source region of said second conductivity type provided in an upper surface of said third impurity region; and a buried impurity region of said second conductivity type provided under said second impurity region and at said interface between said semiconductor layer and said semiconductor substrate, said buried impurity region being higher in impurity concentration than said semiconductor layer, wherein said first trench isolation structure comprises an in-line portion which extends from said first impurity region towards said second impurity region, said in-line portion including a plurality of spaced-apart first conductive films provided in said semiconductor layer defined in said RESURF isolation region, aligning in the extending direction of said in-line portion, and a plurality of first insulating films for covering respective ones of said plurality of conductive films, at surfaces buried in said semiconductor layer, wherein said semiconductor device comprises a plurality of test structures operative to function as a monitor to evaluate manufacturing process of said in-line portion of said first trench isolation structure, said plurality of test structures each comprising a second trench isolation structure for defining a certain region in said semiconductor layer, extending from said upper surface of said semiconductor layer to reach at least the vicinity of said interface with said semiconductor substrate, said second trench isolation structure including a plurality of spaced-apart second conductive films provided in said semiconductor layer, and a plurality of spaced-apart second insulating films for covering respective ones of said plurality of second conductive films, at surfaces buried in said semiconductor layer, and wherein a distance between adjacent ones of said plurality of second insulating films differs between said plurality of test structures, said method comprising the steps of:

(a) in each one of said plurality of test structures, measuring a leakage current flowing between said semiconductor layer opposite to said certain region with respect to said second trench isolation structure and said semiconductor layer in said certain region; and (b) evaluating manufacturing process of said in-line portion in said first trench isolation structure using said leakage current measured in said step (a).

* * * * *